US00RE44878E

(19) United States
(12) Reissued Patent
Daughton et al.

(10) Patent Number: US RE44,878 E
(45) Date of Reissued Patent: May 6, 2014

(54) CURRENT SWITCHED MAGNETORESISTIVE MEMORY CELL

(75) Inventors: James M. Daughton, Eden Prairie, MN (US); Arthur V. Pohm, Ames, IA (US); Mark C. Tondra, Minneapolis, MN (US)

(73) Assignee: NVE Corporation, Eden Prarie, MN (US)

(21) Appl. No.: 13/617,738

(22) Filed: Sep. 14, 2012

Related U.S. Patent Documents

Reissue of:
(64) Patent No.: 6,744,086
Issued: Jun. 1, 2004
Appl. No.: 10/147,367
Filed: May 15, 2002

U.S. Applications:
(60) Provisional application No. 60/291,209, filed on May 15, 2001.

(51) Int. Cl.
*H01L 21/02* (2006.01)

(52) U.S. Cl.
USPC ..... 257/295; 257/108; 257/421; 257/422; 257/424

(58) Field of Classification Search
USPC ..... 257/295, 108, 421, 422, 424; 365/158, 365/171, 173
See application file for complete search history.

(56) References Cited

U.S. PATENT DOCUMENTS

| | | | |
|---|---|---|---|
| 4,476,454 | A | 10/1984 | Aboaf et al. |
| 4,731,757 | A | 3/1988 | Daughton |
| 4,780,848 | A | 10/1988 | Daughton |
| 5,565,695 | A | 10/1996 | Johnson |
| 5,587,943 | A | 12/1996 | Torok et al. |
| 5,629,549 | A | 5/1997 | Johnson |
| 5,640,343 | A | 6/1997 | Gallagher et al. |
| 5,650,958 | A | 7/1997 | Gallagher |
| 5,654,566 | A | 8/1997 | Johnson |
| 5,659,499 | A | 8/1997 | Chen |
| 5,691,936 | A | 11/1997 | Sakakima et al. |
| 5,695,864 | A | 12/1997 | Slonczewski |
| 5,715,121 | A | 2/1998 | Sakakima et al. |

(Continued)

FOREIGN PATENT DOCUMENTS

| | | | |
|---|---|---|---|
| EP | 910092 | A2 | 4/1999 |
| EP | 913830 | A2 | 6/1999 |
| WO | 9820496 | A1 | 5/1998 |
| WO | 9914758 | A1 | 3/1999 |

OTHER PUBLICATIONS

J.C. Slonczewski, Letter to the Editor: Current-driven excitation of Magnetic Multilayers, Journal of Magnetism and Magnetic Materials 159 (1996) L1-L7, Dec. 19, 1995.

(Continued)

*Primary Examiner* — Douglas Menz
(74) *Attorney, Agent, or Firm* — Kinney & Lange, P.A.

(57) ABSTRACT

A ferromagnetic thin-film based digital memory cell with a memory film of an anisotropic ferromagnetic material and with a source layer positioned on one side thereof so that a majority of conduction electrons passing therefrom have a selected spin orientation to be capable of reorienting the magnetization of the film. A disruption layer is positioned on the other side of the memory film so that conduction electrons spins passing therefrom are substantially random in orientation. The magnitude of currents needed to operate the cell can be reduced using coincident thermal pulses to raise the cell temperature.

105 Claims, 14 Drawing Sheets

(56) References Cited

U.S. PATENT DOCUMENTS

| | | | |
|---|---|---|---|
| 5,734,605 | A | 3/1998 | Zhu |
| 5,764,567 | A | 6/1998 | Parkin |
| 5,768,181 | A | 6/1998 | Zhu et al. |
| 5,953,248 | A | 9/1999 | Chen |
| 5,966,323 | A | 10/1999 | Chen et al. |
| 6,055,179 | A | 4/2000 | Koganei et al. |
| 6,069,820 | A | 5/2000 | Inomata et al. |
| 6,124,711 | A | 9/2000 | Tanaka et al. |
| 6,130,814 | A | 10/2000 | Sun |
| 6,140,838 | A | 10/2000 | Johnson |
| 6,166,948 | A | 12/2000 | Parkin et al. |
| 6,172,902 | B1 | 1/2001 | Wegrowe et al. |
| 6,178,111 | B1 | 1/2001 | Sather |
| 6,178,112 | B1 | 1/2001 | Bessho et al. |
| 6,185,143 | B1 | 2/2001 | Perner |
| 6,256,223 | B1 | 7/2001 | Sun |
| 6,269,018 | B1 | 7/2001 | Monsma |
| 6,272,036 | B1 | 8/2001 | You et al. |
| 6,292,389 | B1 | 9/2001 | Chen et al. |
| 6,376,260 | B1 | 4/2002 | Chen et al. |
| 6,385,082 | B1 | 5/2002 | Abraham et al. |
| 6,396,734 | B2 | 5/2002 | Ishikawa et al. |
| 6,436,526 | B1 | 8/2002 | Odagawa et al. |
| 6,438,026 | B2 | 8/2002 | Gillies et al. |
| 6,469,926 | B1 | 10/2002 | Chen |
| 6,535,416 | B1 | 3/2003 | Daughton et al. |
| 6,538,919 | B1 | 3/2003 | Abraham et al. |
| 6,611,405 | B1 | 8/2003 | Inomata et al. |
| 6,657,888 | B1 | 12/2003 | Doudin et al. |

OTHER PUBLICATIONS

L. Berger, Emission of spin waves by a magnetic multilayer traversed by a current, The American Physical Society, Physical Review B, vol. 54, No. 13, 9353-9358, Oct. 1, 1996.

J.-E. Wegrowe, D. Kelly, Y. Jaccard, Ph. Guittienne and J.-Ph. Ansermet, Current-induced magnetization reversal in magnetic nanowires, Europhysics Letters Europhys. Lett., 45 (5), pp. 626-632 Mar. 1, 1999.

E.B. Myers, D. C. Ralph, J. A. Katine, R. N. Louie, R. A. Buhrman, Current-Induced Switching of Domains in Magnetic Multilayer Devices, American Association for the Advancement of Science, Science vol. 285, 867-870, www.sciencemag.org, Aug. 6, 1999.

Anabela Veloso, Paulo P. Freitas, Spin valve sensors with synthetic free and pinned layers, Journal of Applied Physics vol. 87, No. 9, May 1, 2000, pp. 5744-5746.

J.A. Katine, F.J. Albert, R.A. Buhrman, E.B. Myers , D.C. Ralph, Current-Driven Magnetization Reversal and Spin-Wave Excitations in Co/Cu/Co Pillars, Physical Review Letters vol. 84, No. 14, Apr. 3, 2000 pp. 3149-3152.

J.-E. Wegrowe, Thermokinetic approach of the generalized Landau-Lifshitz-Gilbert equation with spin-polarized current, The American Physical Society, Physical Review B, vol. 62, No. 2, 1067-1074, Jul. 1, 2000.

J.-E. Wegrowe, D. Kelly, X. Hoffer, Ph Guittienne, J.-Ph. Ansermet, Tailoring AMR and GMR Hysteresis Loops with Spin-Polarized Current Injection. Institut de Physique Experimentale, Ecole Polytechnique Fedeale de Lausanne, CH- 1015 Lausanne, Switzerland, Dec. 4, 2000.

YA. B. Bazaliy, B.A. Jones and Shou-Cheng Zhang, Modification of the Landau-Lifshitz Equation in the Presence of a Spin-Polarized Current in Colossal- and Giant-Magnetoresistive Materials, The American Physical Society, Physical Review B, vol. 57 No. 6, R3213-R3216, Feb. 1, 1998-II.

A. Veloso, P.P. Freitas, and L. v. Melo, Spin Valves with Synthetic Ferrimagnetic and Antiferromagent Free and Pinned Layers, IEEE Trans. Magn. 35, 2568 (1999).

V.S. Speriosu, B.A. Gurney, D.R. Wilhoit, and L.B. Brown, Spin Valves with Snthetic Ferrimagnets, Presented at Intermag '96.

M.I. D'Yakonov and V.I. Perel', A.F. Ioffe Physico-technical Institute, USSR Academy of Sciences, ZhETF Pis. Red. 13, No. 11, 657-660, Jun. 5, 1971.

M. I. D'Yakonov, V. I. Perel, Possibility of Orienting Electron Spins with Current, USSR Academy of Sciences, Jun. 5, 1971, pp. 467-469.

M. I . Dyakono, V. I. Perel, Current-Induced Spin Orientation of Electrons in Semiconductors, Physics Letters vol. 35A, No. 6, Jul. 12, 1971, pp. 459-460.

T. Valet, A. Fert, Theory of the perpendicular magnetoresistance in magnetic multilayers, Physical Review B, vol. 48, No. 10, Sep. 1, 1993, pp. 7099-7113.

F. J. Albert, J. A. Katine, R. A. Buhrman, D.C. Ralph, Spin-polarized current switching of a Co thin film nanomagnet, Applied Physics Letters vol. 77, No. 23, Dec. 4, 2000, pp. 3809-3811.

Daughton, "Magnetoresistive Random Access Memory (MRAM)", published Feb. 4, 2000.

A. Veloso and P.P. Freitas. Spin Valve Sensors with Synthetic Free and Pinned Layers. *Journal of Applied Physics*, vol. 87 No. 9, 5744-5746, May 1, 2000.

CURRENT SWITCHED MAGNETORESISTIVE MEMORY CELL

Matter enclosed in heavy brackets [ ] appears in the original patent but forms no part of this reissue specification; matter printed in italics indicates the additions made by reissue.

CROSS-REFERENCE TO RELATED APPLICATION(S)

This application claims the benefit of Provisional Application No. 60/291,209 filed May 15, 2001 for "CURRENT SWITCHED MAGNETORESISTIVE MEMORY CELL".

BACKGROUND OF THE INVENTION

The present invention relates to ferromagnetic thin-film structures exhibiting relatively large response magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separation material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and a low power dissipation memory through use of a cell structure that has a spin dependent tunneling junction (SDTJ), or magnetoresistive tunnel junction (MTJ), device therein based on a pair of ferromagnetic thin film layers having an electrical insulator layer therebetween of sufficient thinness to allow tunneling currents therethrough. This memory cell can be fabricated using ferromagnetic thin-film materials of similar or different kinds in each of the magnetic memory films present in a "sandwich" structure on either side of an intermediate nonmagnetic layer where such ferromagnetic films may be composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by their magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied fields. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

An example of a two state magnetoresistive device structure that is generally common to both of these kinds of memory cells is the "pinned sandwich" structure shown in the layer diagram of FIGS. 1A and 1B where the section line of FIG. 1B defines the view shown in FIG. 1A. This layer diagram gives an indication of the structural layers, but is not a true cross section view in that many dimensions there are exaggerated or reduced relative to one another for purposes of clarity.

A substrate, 2, supports an interconnection structure, 3, as the bottom contact electrode to a magnetic material (ferromagnetic material) free layer, 4, (meaning its magnetization is relatively free to be rotated to an alternative orientation) that is separated by a nonmagnetic material spacer layer, 5, from a magnetic material (ferromagnetic material) relatively fixed layer, 6, (meaning its magnetization is much less free to be rotated to an alternative orientation, i.e. "pinned"). This "pinning" of layer 6 is provided by a further magnetic material layer, 7, the "pinning" layer, that is of an antiferromagnetic material which is magnetically coupled to pinned layer 6 and thereby serves to make this two layer pinned structure relatively resistant to rotation of its initial joint magnetization direction in the presence of moderate external applied magnetic fields. An aluminum cap layer, 8, serves as the device top contact electrode providing a conductive path to a further interconnection, 9.

If spacer layer 5 is an electrical conductor, such as Cu, then the structure will exhibit the giant magnetoresistive (GMR) effect and be termed a "spin valve". If spacer layer 5 is an electrical insulator, such as $Al_2O_3$, that is sufficiently thin, then the device will exhibit the spin dependent tunneling effect and be termed a "magnetic tunnel junction". In either situation, the electrical resistance of the device is typically higher when the magnetizations of the free and fixed layers on either side of the spacer layer are oriented antiparallel to one another, and is lower when these magnetizations are oriented parallel to one another. The electrical resistance versus external applied magnetic field response characteristic for a spin valve that is measured for sense current being established across the magnetic material layers with the conductive layer therebetween is greater in terms of fractional change than that characteristic measured for the sense current established parallel to these layers because the entire collection of spins in the sense current electrons is forced to interact with both magnetic material layers for the sense current being established across these layers but only a fraction of these electrons interact with both layers for sense currents established parallel thereto.

Plots of the high externally applied magnetic field range and the low externally applied magnetic field range response characteristics of a typical spin valve are shown in the graphs of FIGS. 2A and 2B, respectively. The device resistance versus externally applied magnetic field response characteristics of a magnetic tunnel junction are qualitatively similar. However, the magnitudes of the resistance values and the resistance change values may be quite different. FIG. 2B shows that at moderately high positive externally applied magnetic fields the device resistance is largest, corresponding to the antiparallel alignment of the magnetizations of free and fixed layers 4 and 6; and the device resistance is smallest for moderately high negative externally applied magnetic fields, corresponding to the parallel alignment of the magnetizations of free and fixed layers 4 and 6.

As stated above, operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells thereby giving rise to such magnetic fields so that selection of a cell occurs through coincident presences of such fields at that cell. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

Such memory cells can be modified to use Curie point or Néel point data storage, or writing, techniques based on the thermal pulse accompanying a current pulse provided in or near the cell. If such storing currents are established that are sufficient to heat these storage layers to the Curie temperature thereof, then much less magnetic field strength would be needed to change the magnetic states of the storage layers and the values of the storing currents could be much reduced to effectively avoid significant magnetization rotation thresholds in the device magnetic material layers.

With or without such thermal pulse techniques, however, as the dimensions of magnetoresistive elements in memory cells shrink to less than 100 nm in size, the problems that must be overcome in order to make successful operating magnetoresistive memories become more difficult. These problems include increasing thermal instability when states thereof are not being switched because less thermal energy is needed to upset the state of smaller memory cells, the needing of larger current densities to overcome greater demagnetization fields to store information, and the greater stray field interactions between adjacent memory cells on a common substrate. Thus, there is a desire for alternative, or supplemental methods, for storing information in magnetoresistance based memory cells.

BRIEF SUMMARY OF THE INVENTION

The present invention provides a ferromagnetic thin-film based digital memory cell formed on a substrate supporting a bit structure with a memory film of an anisotropic ferromagnetic material capable of conducting an electrical current therethrough with a source layer positioned on one side thereof also capable of conducting an electrical current therethrough so that a majority of conduction electrons passing therefrom have a selected spin orientation to be capable of reorienting the magnetization of the memory film. A disruption layer is positioned on another side of the memory film capable of conducting an electrical current therethrough so that conduction electrons spins passing therefrom are substantially random in orientation. The magnitude of currents needed to operate the cell can be reduced using coincident thermal pulses to raise the cell temperature.

DETAILED DESCRIPTION

In high-density magnetic memory cell arrays, a common problem is to make the memory cells magnetically stable (so they retain information indefinitely without requiring energy) while also being easily switchable between alternative memory states as the basis for storing binary bits of data. The switching of one cell must not disturb the magnetic state of another nearby cell in the array. Such highly controllable switching events are desired to be performed using as little time and energy as possible.

In the case of both spin valve and magnetic tunnel junction devices described above, the purpose of the spacer layer is to keep the magnetizations of the free and fixed magnetic material layers separated from coupling to one another while allowing passage of electrons between these two layers. In a properly constructed spin valve or magnetic tunnel junction device, the passage of electrons through the metallic Cu spacer layer 5, or the insulating $Al_2O_3$ spacer layer 5, does not significantly affect the magnetic orientation of a given electron spin. Rather, the spin orientation is largely preserved until the electron interacts with the magnetic layer that it is passing into. These needs and this latter behavior are the basis for the memory cells to be described below.

Figure 3:
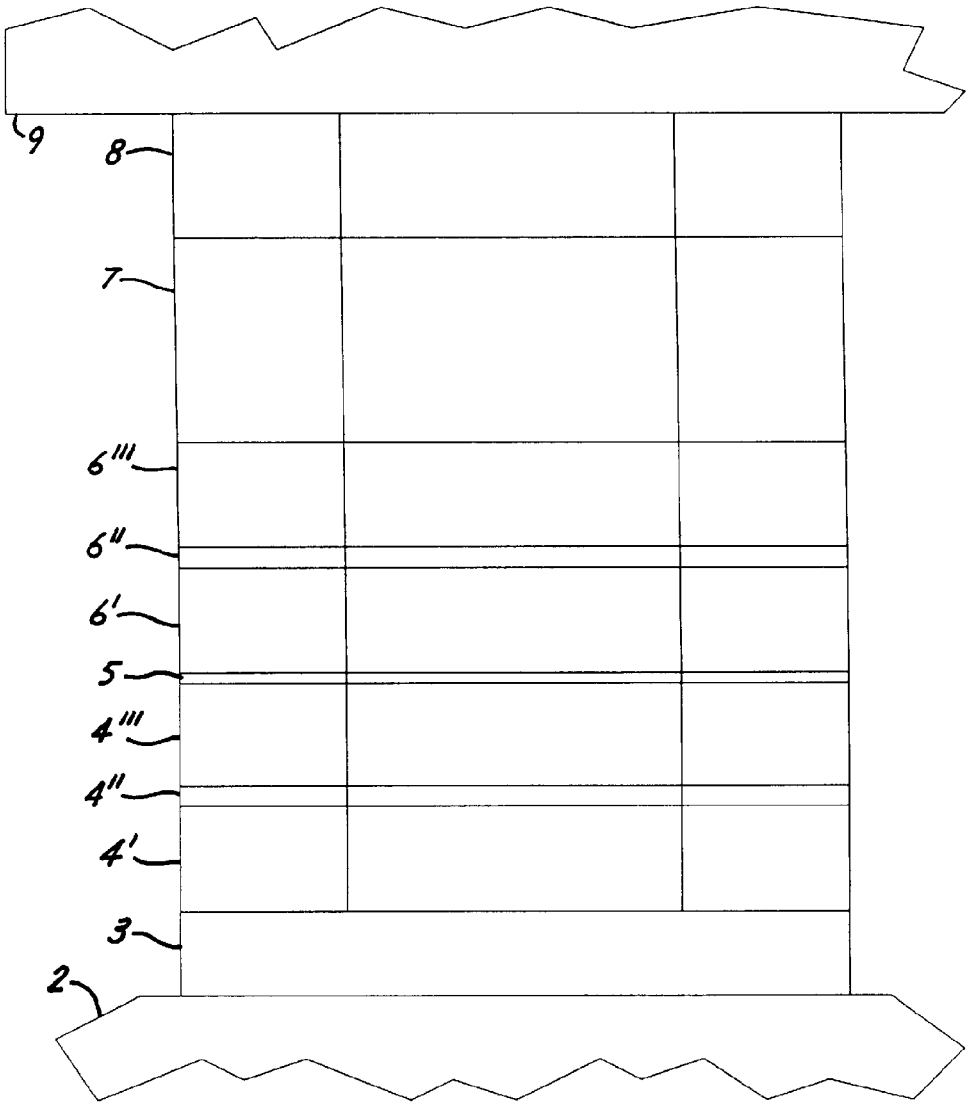
FIGS. 3, 4, 5A and 5B represent layer diagrams of portions of monolithic integrated circuit structures embodying the present invention.

A device structure, whose utility for these purposes will be explained in more detail later, is shown in FIG. 3 that is a modification of the devices shown in FIG. 1. Pinned magnetic material layer 6 in the device of FIG. 1A has been replaced by a composite pinned layer comprised of a "synthetic antiferromagnetic" (SAF) layer. Together, Co layer 6', Ru layer 6", and Co layer 6'" form this SAF structure, which again is a magnetically fixed or pinned layer with respect to externally applied magnetic fields and, by virtue of this modified structure, has higher effective pinning capability in being resistant to magnetization rotation in the presence of greater externally applied magnetic fields and further through this "sandwich" structure providing a more closed magnetic path leads to lower stray magnetic fields emanating therefrom to interfere with neighboring devices, and vice verse.

Figure 1B:
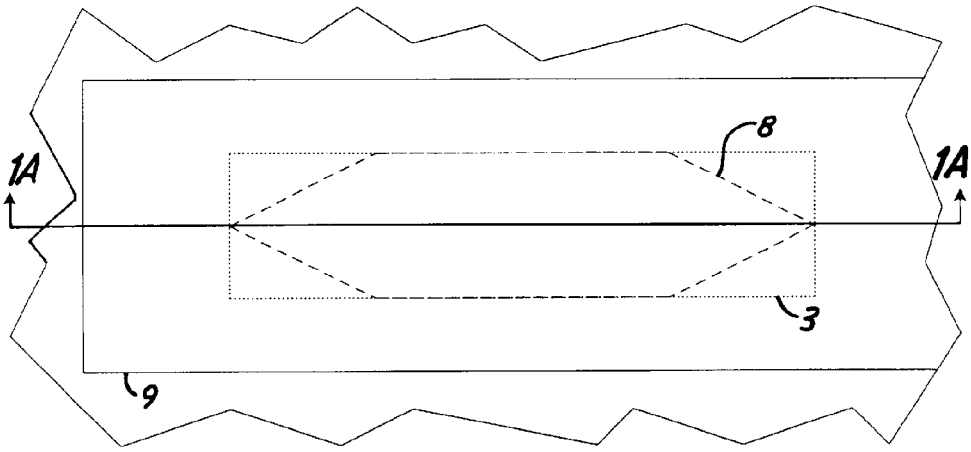
FIGS. 1A and 1B represent a layer diagram of a portion of monolithic integrated circuit structure.
Figure 1A:
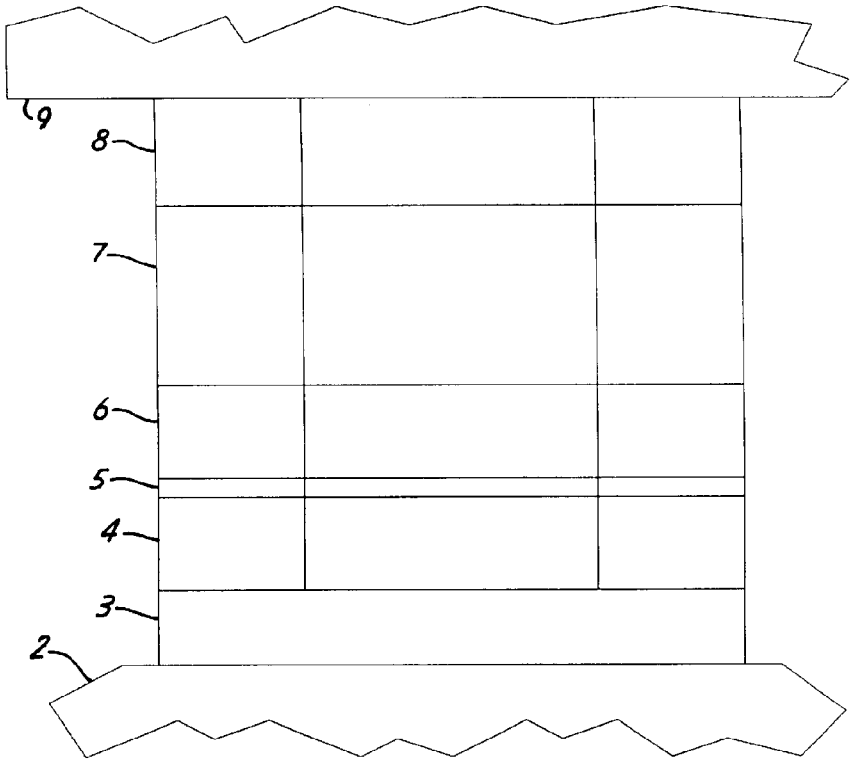

In addition, magnetically free layer 4 in the device of FIG. 1A has also been replaced by another SAF structure including Co layer 4', Ru layer 4", and Co layer 4'". Such a modification, however, while again helping to reduce stray fields, also becomes more resistant to magnetization rotation in the presence of greater externally applied magnetic fields. Thus, this device is much more stable against unwanted changes in its magnetic state, but is also nearly unswitchable by externally applied magnetic fields for wanted changes in its magnetic state. A new switching mechanism is therefore needed. However, though the resulting layer structure for this device is obviously more complicated, the magnetoresistive changes of this device are still determined by the angles occurring between the magnetizations of layers 4''' and 6', and are again qualitatively well represented by the data shown in FIGS. 2A and 2B if the angle between these layer magnetizations can be switched by varying some other variable to be plotted on the abscissas of these graphs as the switching control variable. The new ferromagnetic layer magnetization orientation switching mechanism for memory cells to be used is based on heating for this device as described in connection with FIG. 12, and on the injection of spin-polarized current into the cell storage ferromagnetic layer, termed "spin injection," as the basis for controlling the magnetic state of the device.

In these new spin-polarized current written memory devices, the data storage method involves passing a flow of spin-polarized electrons into the magnetic storage layer in order to switch its magnetic orientation. This flow has been found needed to be at a density approaching $1\times10^7$ Amps/cm$^2$ and to have a large spin polarization. Here, spin polarization is defined as: $\sigma=[\sigma_1-\sigma_1 1]/[\sigma_1\uparrow+\sigma_1]$ where $\sigma_1$ and $\sigma$ are the current densities of the up and down spin channels. "Up" and "down" are defined with respect to the axis of magnetization. When all of the electrons are spin up, the polarization is 1, or 100%, when there are equal numbers of spin up and spin down electrons, the polarization is 0.

Spin channels at the Fermi energy is a concept used to describe the conduction electrons in a solid. Only a fraction of all electrons in a solid are actually available for conduction, which are those having energies near the material Fermi energy, and these electrons are thus at an energy level that is consistent with motion through the atomic lattice of that solid. The "spin channel" idea is based on dividing up all the conduction electrons into two groups: spin up electrons and spin down electrons. To the extent that these two groups have minimal interaction with one another, they can be thought of as an electrical current conduction system having two separate channels. This "spin channel" concept is often referred to as the "two current model". In the past, the two current model and variations thereof have been used with considerable success to describe many phenomena related to spin dependent transport. These observable phenomena include anisotropic magnetoresistance (AMR), giant magnetoresistance (GMR), spin dependent tunneling, and the extraordinary Hall effect. Since these phenomena occur in similar materials systems as are being proposed for the spin momentum transfer devices, the use of the two current model to describe the spin current properties is appropriate.

In transition metals and alloys, including ferromagnetic materials, the electrons that carry charge from place to place in a lattice (the conduction electrons) are known to be the same ones that provide the basis for the resulting magnetic properties of such a material. In other words, their conduction spin polarization is large in such materials. This is in contrast to materials where the magnetic properties of the material are not due to conduction electrons.

Spin-polarized currents can affect the magnetization of a ferromagnetic material through transfer of angular momentum, the angular momentum of an electron being well known to be coupled to its spin property. When an electron interacts with a material in such a way as to flip the direction of spin of that electron, the angular momentum lost by the electron must be transferred to some other entity. This transfer of angular momentum, in the atomic scale view, exerts magnetic torque on the entity with which the interaction occurred. In the case where the entity is the material magnetization, the spin angular momentum is transferred to the material magnetization. This transfer of angular momentum, in the atomic scale view, exerts magnetic torque on the magnetic moment in the material where the interaction occurred.

Consider a single electron traveling in the vertical conduction structure shown in FIG. 1A from a first "source" magnetic layer 6 across spacer layer 5 and then interacting with the magnetization of a second "target" magnetic layer 4. Suppose this interaction leads to a transfer of angular momentum equal to the quantity $\Delta L$. Since angular momentum must be conserved, the total $\Delta L$ lost by an electron is imparted to the magnetization of the layer in which the interaction occurred. If an incoming up spin changes to a down spin, $\Delta L_{magnetic}$ is positive. If a down spin changes to an up spin, $\Delta L_{magnetic}$ is negative.

The absolute value of the angular momentum of each electron is $\hbar/2$ (h is Planck's constant, $\hbar=h/2\pi$. The largest possible angular momentum transfer, then, in a single electron—electron interaction is 2 times this magnitude, or $\hbar$. This is the angular momentum transferred if the initial and final states are oriented 180 degrees apart. i.e. $L_{initial}=+\hbar/2$, $L_{final}-\hbar/2$, so $L_{initial}-L_{final}=\Delta L=\hbar$.

In practice, there are a large number of these interactions taking place per unit time in proportion to the electrical current flowing from or to one magnetic layer to or from another adjacent layer. In other words, the number per unit time=I/e where I=current in amps and e is the electron charge. The net spin transfer per unit time is also proportional to the spin polarization as defined above. Thus $$dL/dt\propto\sigma I.$$

The magnetic torque exerted on the magnetic moment of the material at time t is defined as $$\tau(t)=dL/dt,$$

and therefore $\tau(t)=\propto\sigma I$

This disturbance of an electron's spin, sometimes referred to as "spin flip scattering", happens all the time in a material including when a current passes therethrough. But in most cases the net angular momentum transfer is nil because the number of flips from up to down are equal to the flips down to up. Only in the special case where the spin polarization of the incoming charge carriers is different than the spin polarization of the outgoing charge carriers is there a net transfer of angular momentum. When the sum of all these angular momentum transfers is high enough, the magnetization direction of a magnetic material can be caused to rotate.

In order to quantitatively calculate the net momentum transfer due to a polarized electron current flowing from one magnetic layer into another, one must know the total current, I, the net spin polarization, $\sigma$, and the angle $\theta$ between the magnetizations of the two layers. Assume that all of the spins from source layer 2 interact within target layer 1 so that the net spin polarization is completely dissipated. A formulation for the torque magnetic torque exerted on the magnetic moment of the material for arbitrary relative orientations of the layer magnetizations has been found to be $$\frac{d\vec{M}_1}{dt} = \gamma \frac{\hbar}{2} \frac{j}{te} \left[ \frac{\hat{m}_1 \times (\hat{m}_1 \times \hat{m}_2)}{\sigma^{-3/2}(1+\sigma)^3(1+\cos(\theta)) - 4} \right].$$

Here, $\vec{M}_1$ and $\vec{M}_2$ are the magnetizations of the target and source magnetic layers, respectively, having corresponding unit vectors $\hat{m}_1$ and $\hat{m}_2$; θ is the angle between $\vec{M}_1$ and $\vec{M}_2$; σ is the spin polarization as defined above, j=I/(area of target layer impingement surface) is the current density (Amps/$cm^2$), e is the electron charge, and t is the thickness of the target layer (in cm). Note that the area times thickness is the volume of the target layer.

This torque calculation assumes a number of things, such as 100% spin transfer, and that all of the spin interactions occur within the target magnetic layer (i.e. the mean free path is much longer than the spacer between two magnetic layers, and much less than the thickness of each of the two layers). It also assumes that the layer target layer magnetization is free to rotate.

These relationships are, by definition, the result of the average of many electron-electron interactions. The polarization, θ, refers to the average spin polarization of the entire ensemble of conduction electrons. Likewise, the current density, j, is the average current density passing through the major surfaces of the magnetic material layers of the device.

This equation tells about the torque at a given point in time based on the relative orientations of magnetizations. A full calculation of the switching process (making the magnetization flip from one orientation to another) requires incorporating this instantaneous torque equation into the dynamic switching relationships known as the Landau-Lifshitz-Gilbert equation, or $$d\vec{M}/dt = -\gamma \vec{M} \times \vec{H} + (\alpha/|\vec{M}|)\vec{M} \times (d\vec{M}/dt).$$

Adapting this equation to the present situation yields $$\frac{d\vec{M}_1}{dt} = -\vec{M}_1 \times \left\{ \gamma \vec{H}_{eff} - \alpha \frac{d\hat{m}_1}{dt} - \frac{\gamma}{|M_1|} \frac{\hbar}{2} \frac{j}{te} \left[ \frac{(\hat{m}_1 \times \hat{m}_2)}{\sigma^{-3/2}(1+\sigma)^3(1+\cos(\theta)) - 4} \right] \right\}$$

where $\vec{H}_{eff}$ is the total effective magnetic field, γ the gyromagnetic ratio, and α is the damping constant. $\vec{H}_{eff} = \vec{H}_{anis}\cos(\theta) + \vec{H} - \vec{H}_{ex}$ is the sum of anisotropy, applied, exchange, and demagnetizing fields, θ represents the angle between the magnetizations of the two magnetic layers. The first term is the net torque due to all magnetic fields, the second term is damping, and the third term is the spin momentum transfer.

The damping factor, α, in the LLG equation is an empirically measured term that takes into account all means of energy transfer from magnetic rotation to other forms. Several physical phenomena play a role in damping. Excitations such as photons, phonons, and magnons contribute to a larger and lesser degree, respectively. Thermal heating due to eddy currents and interactions with atomic nuclei also contribute.

Spin currents can switch a magnetic cell having approximately 400 Oe of effective anisotropy (shape and crystalline anisotropy) with a current density of $10^7$ A/$cm^2$. This has been accomplished by flowing electrons first through a highly spin polarizing material (cobalt), then through a thin layer (probably epitaxial) layer of copper, and into a thinner layer of cobalt having the magnetization direction to be switched.

An important related demonstration is that sufficient electrical current density in the opposite direction results in reversing the magnetic switching. As mentioned above, the calculation of magnetization rotation assumes that the target layer is magnetically free to rotate. In cases where the source layer is freer to rotate than the target layer, a large fraction of one spin channel can be reflected at the spacer-target interface. These reflected spins then interact with the source layer and cause its magnetization to rotate.

The foregoing discussion has addressed the nature of angular momentum transfer from spins to other spins and magnetizations, the relationship between this transfer and torque on the magnetization of materials, and the dynamic "equations of motion" for magnetization under the influence of fields and spin currents. We further the explanation here with a discussion of the relationship between spin polarized currents and choices of material structures in the device. Certain thicknesses and arrangements of magnetic layers are advantageous for the exploitation of the spin current switching effect. These design choices depend on the location at which the spin polarized current interacts with the magnetization.

The depth of penetration, closely related to the "spin flip length", of an incident spin current is highly dependent on the spin orientation. "Spin up" electrons are defined as those spins orientated parallel to the material magnetization, and "spin down" electrons are defined as those spins oriented anti-parallel to the material magnetization. The flipping of spin down electrons is the fundamental mechanism for the transfer of angular momentum to the magnetization and the resulting torque on the magnetization. Flipping of spin up electrons only reinforces the existing magnetization orientation. The scattering probability of spin down electrons is much higher than that of spin up electrons. This means that the momentum transfer of an incident spin down current takes place much sooner (shallower) than an incident spin up current. The ratio of the spin flip lengths is on the order of 10, so that the spin flip length (sfl) of spin down electrons is about 1 nm while the sfl of spin up electrons is about 10 nm. These two factors indicate that the optimum thickness for a target magnetic layer is longer than the spin down sfl, and shorter than the spin up sfl. This means the target layer thickness could be up to a few 10s of nm. Added thickness of the target layer, however, increases the total required momentum transfer since the magnetic anisotropy energy is proportional to the volume.

The introduction of thin ruthenium layers between ferromagnetic layers (NiFe, for instance) can help to optimize the angular momentum transfer in a relatively thin target layer. Thin Ru layers are effective spin scattering layers which randomize electron spins passing through that layer, and they strongly antiparallelly couple such ferromagnetic layers provided on either side thereof. In such a SAF pair, one of the two magnetic layers acts as the "target" layer for an incoming spin current. The SAF has several desirable features for dense MRAM. Self-demagnetizing effects are greatly reduced by the presence of compensating magnetic free poles at the device edges, regardless of the magnetization orientation. Stray fields, which can cause undesirable magnetic interactions with nearby bits, are greatly reduced when a SAF structure is used compared to a single magnetic film structure. The effective anisotropy of the SAF is the same as for a single film, and the anisotropy energy is proportional to the total volume of the two magnetic layers. The effect of external fields is drastically lower because the magnetostatic energy of the two antiparallel layers cancel each other. In total, the SAF structure is more sensitive to internal spin polarized switching currents, less sensitive to external stray fields, and has reduced magnetostatic interactions with nearby magnetic elements.

In addition to magnetostatic considerations, the Ru layer provides an important spin randomization effect. This effect prevents the spin polarized current from exerting significant torque on the non-target film of the SAF. In absence of this spin randomization effect, the spin polarized current which does not transfer its angular momentum to the target layer will then pass through to the non-target layer and exert a torque in the opposite direction to that intended. Due to the spin scattering effect of the Ru layer, the spin up electrons in the current through the target ferromagnetic layer are randomized before they reach the non-target ferromagnetic layer so that relatively small net torque is exerted upon the magnetization of that non-target layer. The antiferromagnetic coupling between the two ferromagnetic layers due to the ruthenium layer therebetween thus allows the torque in the first layer to switch magnetization directions of the two ferromagnetic layers together.

Magnetic tunnel junctions can be fabricated with down to 1 $\Omega$-$\mu m^2$ barrier resistance area product with magnetoresistance change ratio of 40%. Such a thin barrier will be necessary to allow for the occurrence of sufficient current density magnitudes so as to be capable of switching the magnetic storage layers in memory cells.

Minimizing the lateral scattering of injection spin current conduction electrons to reduce the polarization losses during transit for better switching requires that such currents be established through the smallest amount of a material layer as possible, i.e. through the thickness of a thin-film layer. This is supported by having the lateral dimensions of such a layer as small as possible to minimize the lateral spreading out of the current over the layer because such spreading leads to an effectively lengthened current path thereby also adding path resistance that does not contribute to the magnetoresistance change based signal. As a result, the lateral dimensions of a layer in a stack of layers forming an operative device will approach, or even be less than, the total thickness of the stacked layers in that device. In an alternative to devices with a magnetic junction, as just mentioned, where instead the barrier layer is replaced by an electrical conductor such as copper, an added benefit of such small lateral dimensions is an increase in path electrical resistance because of the resulting small path cross sectional area.

Thus, a vertical cell having two tunnel junctions one on the other but in series with an inner contact structure therebetween consisting of two ferromagnetic layers (10 to 50 Å thick) sandwiching a ruthenium layer of approximately 7 to 12 Å thickness forms a strongly antiparallel coupled device. Two outside electrodes are pinned synthetic antiferromagnets with the pinning antiferromagnetic materials on the side thereof away from the tunnel junctions. These outside electrodes are permanently magnetized so that the magnetizations of the magnetic layers next to the junction are both oriented in the same direction.

Figure 4:
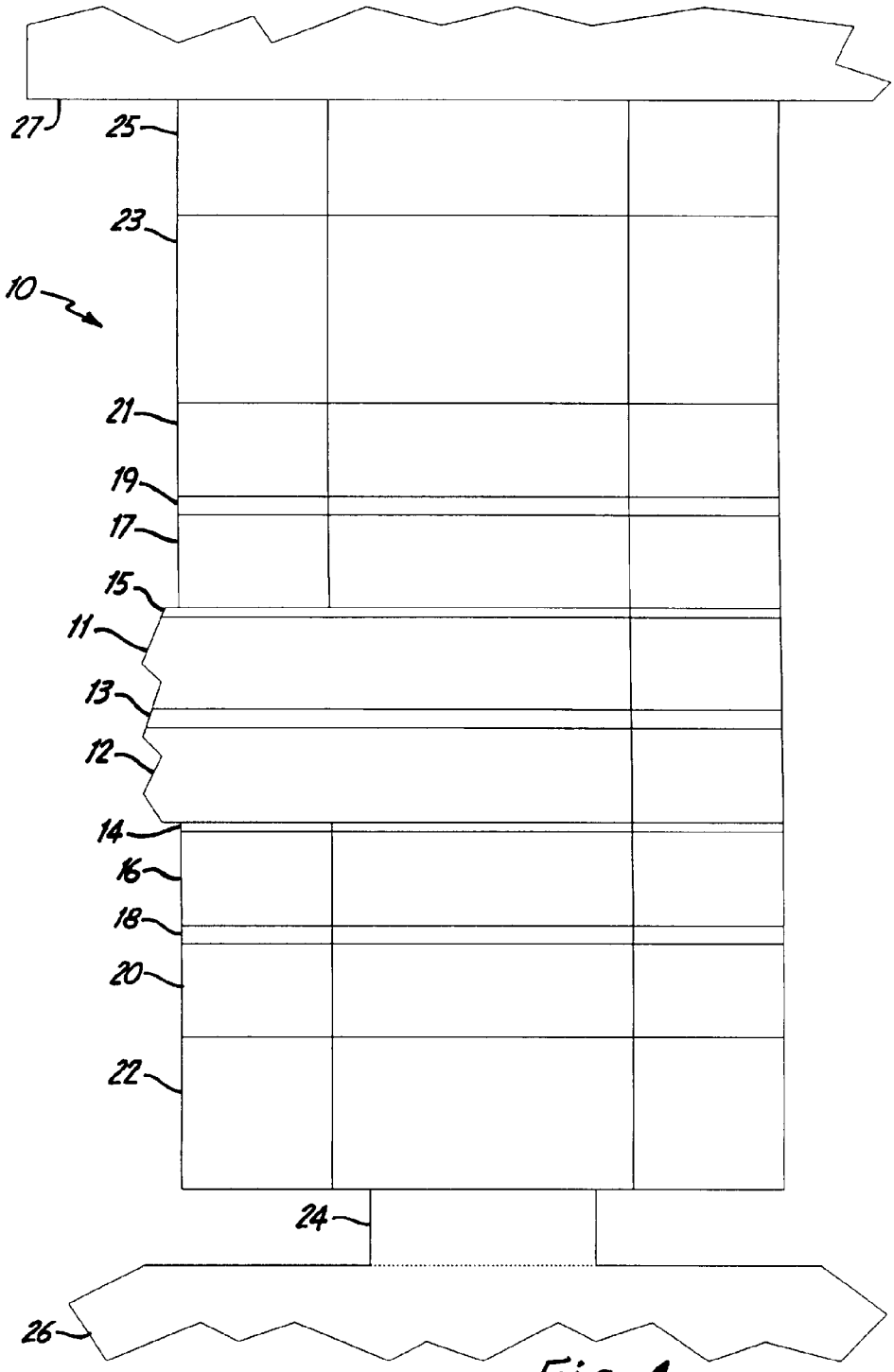

Such a vertically stacked memory cell structure, 10, is representatively shown in the side view of FIG. 4 though with many structural portions reduced or exaggerated for purposes of clarity. A pair of 50 Å thick ferromagnetic layers, 11 and 12, have a 9 Å thick ruthenium layer, 13, provided therebetween to form the inner contact structure and data bit storage layers. On the other side of ferromagnetic layer 12 directly supporting that layer is a 4 Å thick aluminum oxide barrier layer, 14, and directly on the other side of ferromagnetic layer 11 is another 4 Å thick aluminum oxide barrier layer, 15. Another 50 Å thick ferromagnetic layer, 16, directly supporting barrier layer 14 completes a magnetic tunnel junction with barrier layer 14 between ferromagnetic layers 12 and 16. A similar 50 Å thick ferromagnetic layer, 17, directly on barrier layer 15 completes a further magnetic tunnel junction with barrier layer 15 between ferromagnetic layers 11 and 17.

A 9 Å thick ruthenium layer, 18, is provided directly supporting ferromagnetic layer 16, and another 9 Å thick ruthenium layer, 19, is provided directly on ferromagnetic layer 17. A ferromagnetic layer, 20, is provided directly supporting ruthenium layer 18, and a further ferromagnetic layer, 21, is provided directly on ruthenium layer 19. A chrome platinum manganese antiferromagnetic layer, 22, directly supports ferromagnetic layer 20 to form a pinned synthetic antiferromagnetic to pin the magnetization direction of ferromagnetic layer 16 in a selected direction. Similarly, a chrome platinum antiferromagnetic layer, 23, is directly on ferromagnetic layer 21 to form a pinned synthetic antiferromagnetic to pin the magnetization direction of ferromagnetic layer 17 in the same direction as that of ferromagnetic layer 16 along the length of the cell.

A tungsten plug, 24, extending through an electrical insulating layer directly supports and electrically contacts antiferromagnetic layer 22, and an aluminum cap, 25, is directly supported on chrome platinum antiferromagnetic layer 23. A lower electrical interconnection, 26, is in electrical contact with plug 24, and a further electrical interconnection, 27, is in electrical contact with cap 25.

Consider a current being passed through the two barrier junctions such that the electrons pass from top to bottom in FIG. 4. Polarized electrons tunneling from the upper pinned polarization layer 17 through adjacent barrier layer 15 and into ferromagnetic layer 11 in the inner electrode (formed of layers 11, 12 and 13) will create a torque on the magnetization of layer 11. If the current density and polarization are large enough, the magnetization will rotate to be in the same direction as the magnetization of upper polarization layer 17. As the electrons flow on through inner ruthenium layer 13 to ferromagnetic layer 12, the spins of those electrons are randomized. The tight antiferromagnetic exchange coupling of the two ferromagnetic layers will ensure that the other inner magnetization layer 12 will have its magnetization direction remain antiparallel to the direction of magnetization of layer 11 to form a first magnetic state. Reversing the current will reverse the storage of data on inner magnetic layers 11 and 12 by reversing the orientations of the magnetizations of those two layers to form an alternative second magnetic state.

Retrieving stored information is accomplished by injecting smaller currents (less in magnitude than needed for ferromagnetic layer magnetization switching) into each of the outside contacts, and taking both currents out through the center electrode. Observing the voltage difference between the outside electrodes with respect to the inner electrode, which is essentially the voltage drops across the two barrier junctions, will provide the output signal to indicate the storage state as one barrier junction will be in its higher magnetoresistance magnetic state and the other in its lower magnetoresistance magnetic state. A "one" magnetic state and a "zero" magnetic state will provide corresponding output signals which are of opposite algebraic signs.

A small shape anisotropy for the cell of 40 Oe would require that the current density for switching to be $10^6$ A/cm$^2$. This would require 1.0 mA into a junction of 0.1 square micron area ($10^{-9}$ cm$^2$). At 100 mV across each junction, the resistance of the junction would have to be 100 Ohm, which is equivalent to 1.0 $\Omega$-$\mu m^2$ barrier resistance area product.

Thus, this memory cell can have the magnetization directions of the data storage layers 11 and 12 switched by a fairly low spin injected current of 1 mA, and the output signal, using 0.1 mA to read, would be about 8 mV across the cell for a 40% magnetoresistance. The cell would have a small area although making a contact to the inner contact at the device center is a fabrication process challenge.

A structural variation whereby the bottom tunneling layer is replaced with a thin copper layer simplifies making electrical contact for measuring the voltage drop due to the barrier junction tunneling current. A second variation is shown in FIG. 3 which, as described above, has only two SAF structures and only one spacer layer. A third variation is a simplification back to single layer free and pinned films as shown in FIG. 1, although that configuration would suffer from demagnetizing fields at the dimensions where spin current writing is practical. An important improvement in all of these structures is the use of reduced Curie temperature materials to simplify the storing of data bits by applying heat locally, thereby allowing for magnetic-thermal stability in much smaller devices. These thermal issues are described in detail below.

Figure 5A:
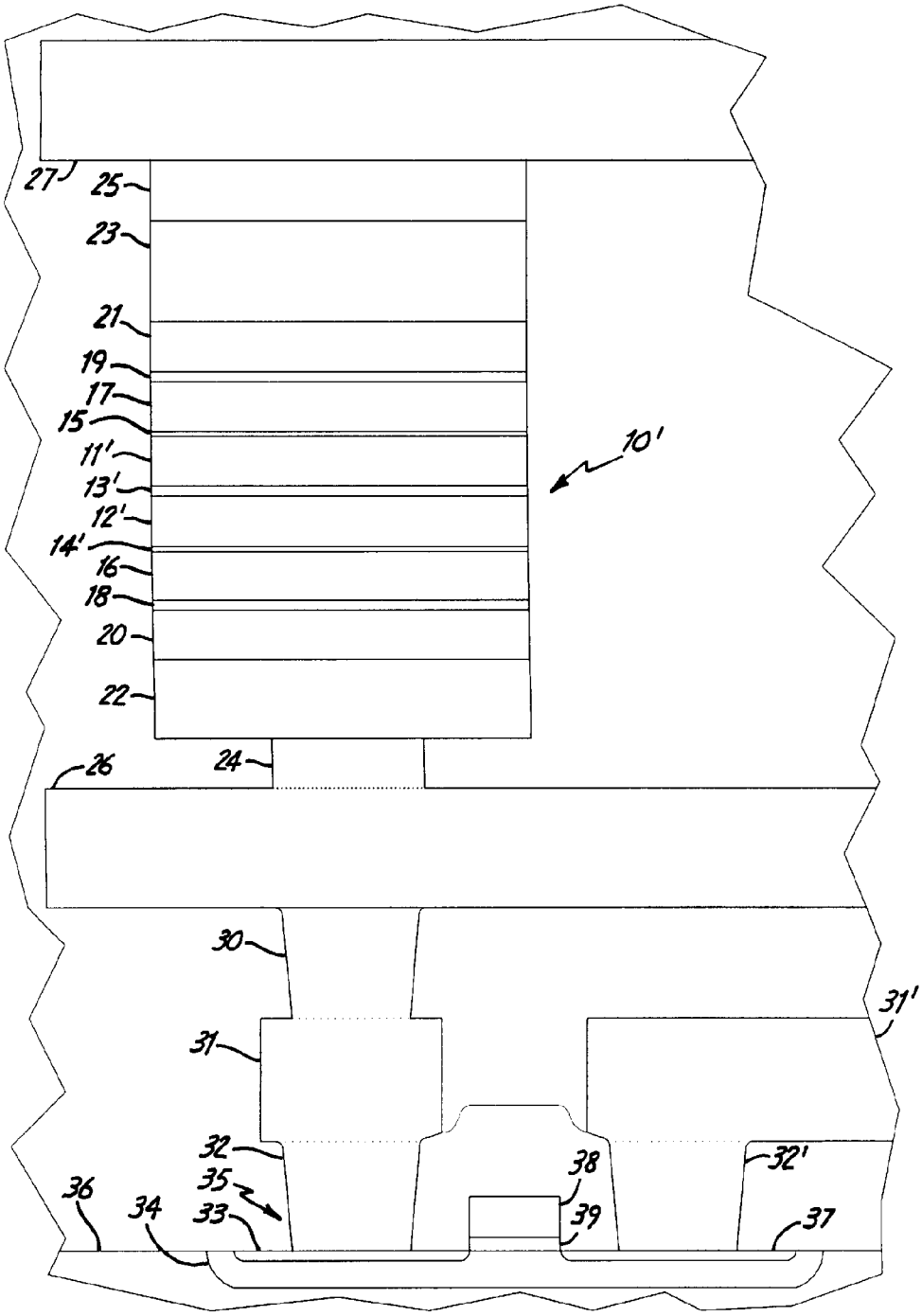

In the first variation, a thin layer of copper, 14', (thin enough to scatter spins significantly) is used in place of bottom tunnel junction barrier layer 14 of memory cell 10 as shown for a corresponding variation memory cell, 10', in the layer diagram of shown in the fragmentary side view of FIG. 5A. FIG. 5A is shown as a layer diagram of a monolithic integrated circuit supported, and integrated, memory cell with the structure shown not being a representative cross section view as many structural portions are reduced or exaggerated for purposes of clarity. In this configuration, there are only two cell electrical contacts necessary. Although the total signal is halved since there is a significant voltage drop over only one tunnel junction and little over the copper layer, it would be easier to fabricate since electrical contact need only be made at the opposite ends of the device by contacts 26 and 27. Since ferromagnetic layers 11 and 12, as storage layers, and ruthenium layer 13, together forming the inner contact for the device of FIG. 4 no longer serve as an electrical contact, they are redesignated 11', 12' and 13' in FIG. 5A.

A conductive riser to electrically contact interconnection 26 (fabrication process second metal layer) is formed of a tungsten plug, 30, a further (first metal) aluminum layer, 31, and a final tungsten plug, 32, extends up from a n+-type conductivity terminating region, 33, in a p+-type conductivity tab, 34, of a metal-oxide-semiconductor-field-effect transistor (MOSFET), 35, formed in an n-type conductivity silicon substrate, 36. MOSFET 35 has another n+-type conductivity terminating region, 37, in tub 34 separated from terminating region 33 by a channel region in tub 34 over which an n+-type conductivity polysilicon gate, 38, is provided separated from tub 34 by a gate oxide layer, 39. Another tungsten plug, 32', rises from terminating region 37 to another portion of first layer metal, 31'. Interconnection 26 here serves as a lead to a voltage measurement circuit, and interconnection 31' is adapted for connection to an electrical energy source with the connection thereto being controlled by the gate signal on MOSFET 35 serving as an electrical switch.

Figure 5B:
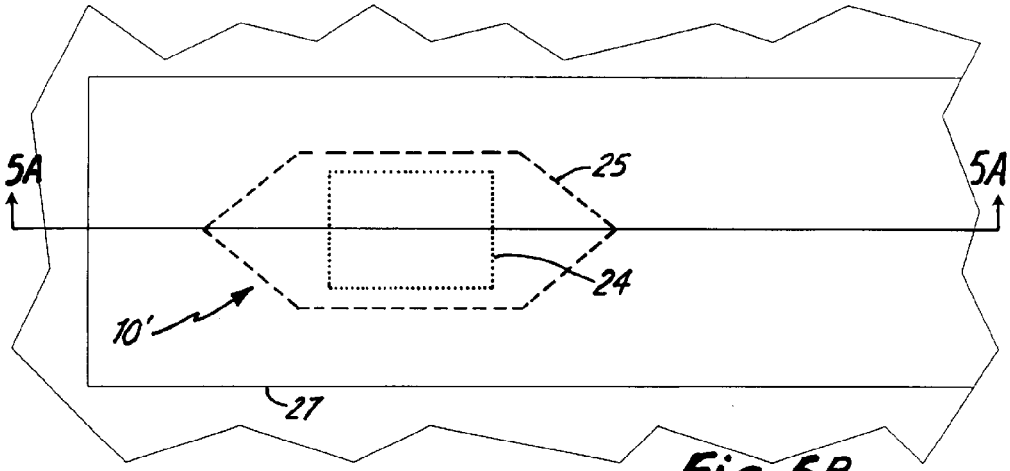

FIG. 5B is a fragmentary top view of a structural region about the memory cell device shown in the layer diagram of FIG. 5A and the immediate electrical interconnections thereto, where view taken in FIG. 5A is indicated by the section line marked with the designation 5A in FIG. 5B. The uppermost interconnection to this cell device is shown in solid lines even it is covered by a protective layer in the actual device structure as this protective layer has been omitted in this view for purposes of clarity. Aluminum cap at the top of memory cell 10' is shown in dashed line form as is tungsten plug 24 at the bottom of memory cell 10'.

As indicated above, random access magnetoresistive memory cell arrays providing two combined operating magnetic fields from coincident currents to switch the magnetic state of a selected memory cell in storing therein a data bit require cell selection electrical currents to be provided along two separate current paths in or adjacent to the array. In some arrangements, the previously described memory cells based on the use of transistor controlled spin injection currents can avoid this sort of cell selection. However, in other arrangements, this sort of selection will still be relied upon, and so have the attendant difficulties to be described in more detail below.

In such a coincident current selection arrangement, only that cell in the vicinity of the crossing location, or intersection, of these two paths experience sufficient magnetic field intensities due to the summing of the fields due to these two currents to cause such a magnetic state change therein. Cells in the array that are located far away from both of these two current paths are not significantly affected by the magnetic fields generated by such currents in the paths because such fields diminish in intensity with distance from the source thereof. Cells, however, located in relatively close proximity to one, but not two, of these two paths do experience more significant magnetic fields thereabout, and those immediately in or adjacent to one such path experience sufficient field intensities to be considered as being "half-selected" by the presence of current in that path intended to participate in fully selecting a different cell along that path at the intersection with the other path on which a selection current is present. Half-selection means that a bit is affected by magnetic fields from the current through one path but not another.

Figure 6:
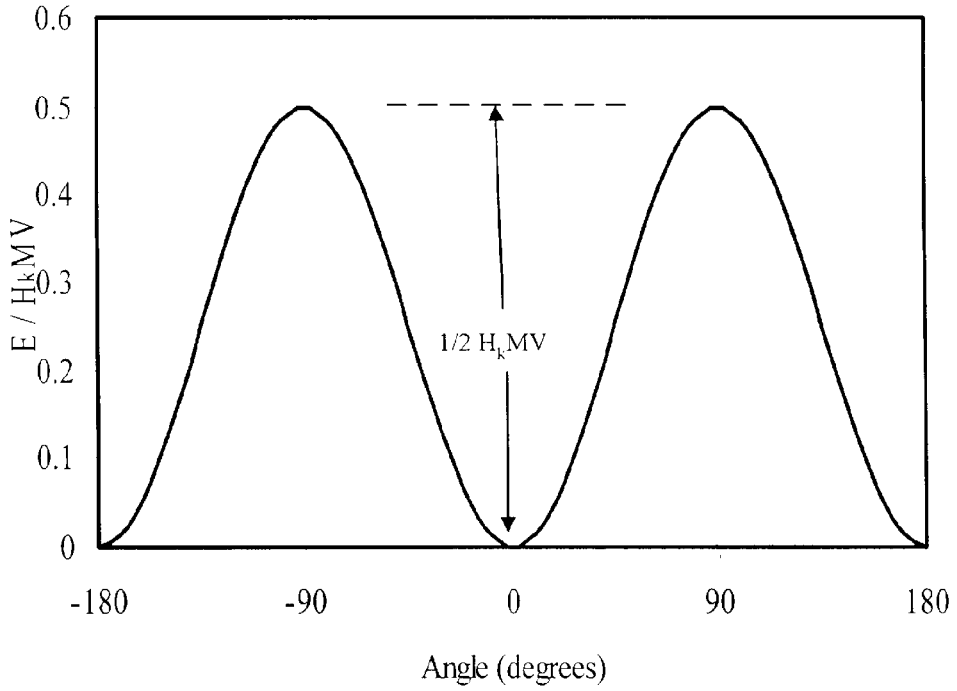
FIGS. 6, 7, 8A and 8B, 9, 10 and 11 represents graph of conditions and response for structures described herein.

The stability of magnetic memory bits can be considered in terms of an "energy well". When the magnetostatic energy of a data storage magnetic material layer (defined below) of a cell is plotted vs. the angle between the magnetization and the easy axis of that layer, there is an energy minimum at the angular value of zero or, with this angle designated as θ, at θ=0 as shown in the graph of FIG. 6. This minimum, having on either side thereof in this plot an energy maximum, that is energy maxima at θ=+90° and θ=−90°, is the "energy well". The depth of the energy well when no external magnetic fields are applied is simply the difference between the energy minimum and maxima. The value of this energy well can be calculated from:

$$E=\tfrac{1}{2}\sin^2\theta|\vec{M}|H_kV$$

where $\vec{M}$ is the magnetization, $H_k$ is the anisotropy, V is the volume, and θ is the angle of $\vec{M}$ from the easy axis. The magnetization orientation will tend to orient to minimize the magnetostatic energy; i.e. θ will tend toward zero degrees.

Figure 7:
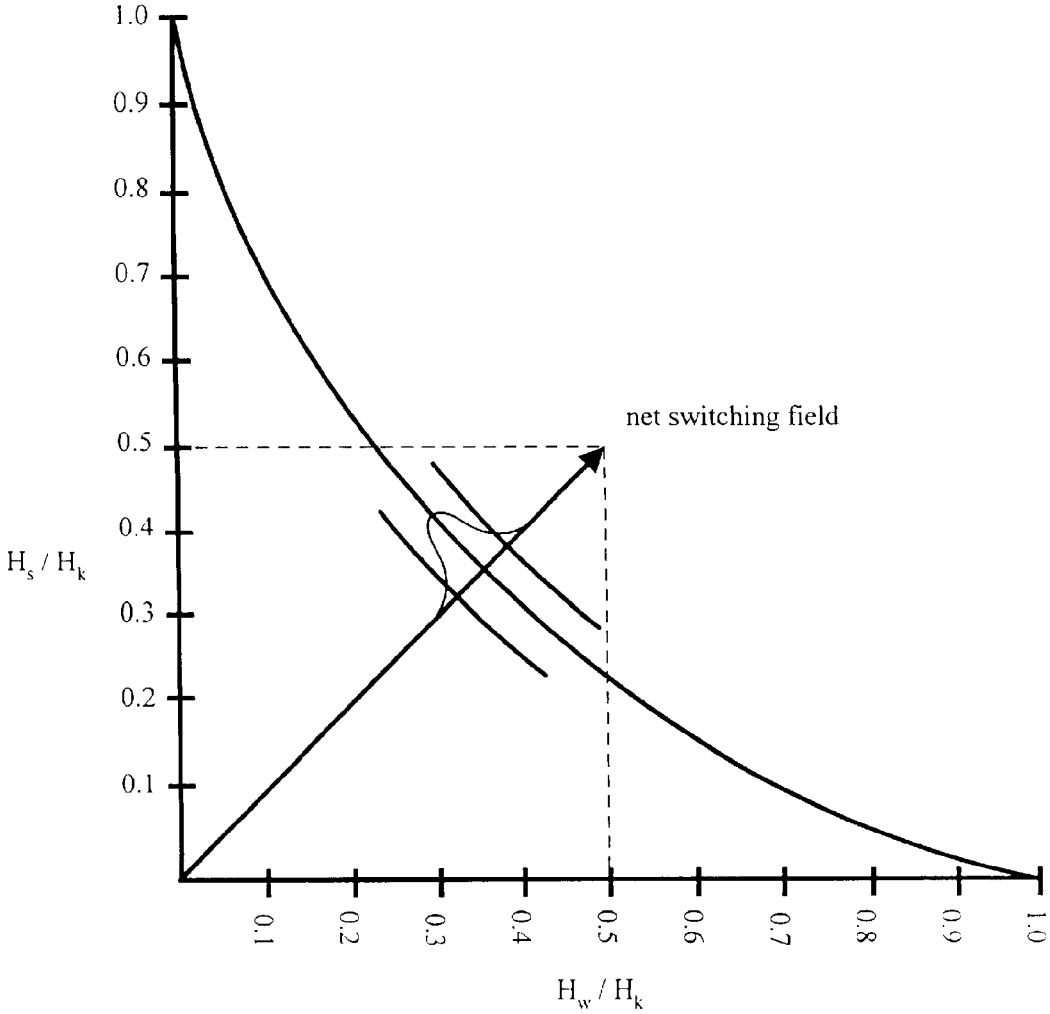

The graph of FIG. 7 shows a Stoner-Wohlfarth switching threshold plot, a portion of an astroid, and reasonable values of the word and sense fields to provide adequate margins for a memory employing coincident current selection. The solid curve in the figure represents the total field required to cause a bit magnetization to switch from one to the other of two stable states. The total field is the vector sum of the word magnetic field $\vec{H}_w$ due to current provided in an adjacent word line, and the sense magnetic field $\vec{H}_s$ due to current provided through the cell which currents are typically applied along current paths following the two orthogonal axes in the plane of the cell array. The Gaussian curve portion shown in the middle of the plot is representative of the distribution of cell applied magnetic field switching threshold values in an array of real memory cells. The memory array design, then, must account for the varying cell switching thresholds encountered in view of this distribution. As illustrated in the figure, design values for the word and sense fields are about ½ the value of $H_k$. The remaining energy well depth of those cells half-selected is about ¼ their non-selected depth. This can be shown through calculating the well depth with half selection magnetic fields both present and absent.

The energy expression above, when modified to include the effects of $\vec{H}_w$ and $\vec{H}_s$, becomes $$E=\tfrac{1}{2}\sin^2\theta|\vec{M}|H_kV-|\vec{M}||\vec{H}_s|V\sin\theta+|\vec{M}||\vec{H}_w|V\cos\theta$$

Here we assume that $\vec{H}_w$ is parallel to the effective easy axis while $\vec{H}_s$ is perpendicular to this axis. The easy axis is parallel to $H_k$.

If a half-select word field is applied (i.e. $|\vec{H}_w|=\tfrac{1}{2}H_k$ and $|\vec{H}_s|=0$), the energy expression becomes:

$$E=\tfrac{1}{2}\sin^2\theta|\vec{M}|H_k+|\vec{M}||\vec{H}_w|V\cos\theta,$$

where the second term is the energy due to the applied word field. If a half-select sense field is applied (i.e. $|\vec{H}_s|=\tfrac{1}{2}H_k$ and $|\vec{H}_w|=0$), the energy expression becomes:

$$E=\tfrac{1}{2}\sin^2\theta|\vec{M}|H_kV-|\vec{M}||\vec{H}_s|V\sin\mathbf{0},$$

where the second term is the energy due to the applied sense field.

Figure 8A:
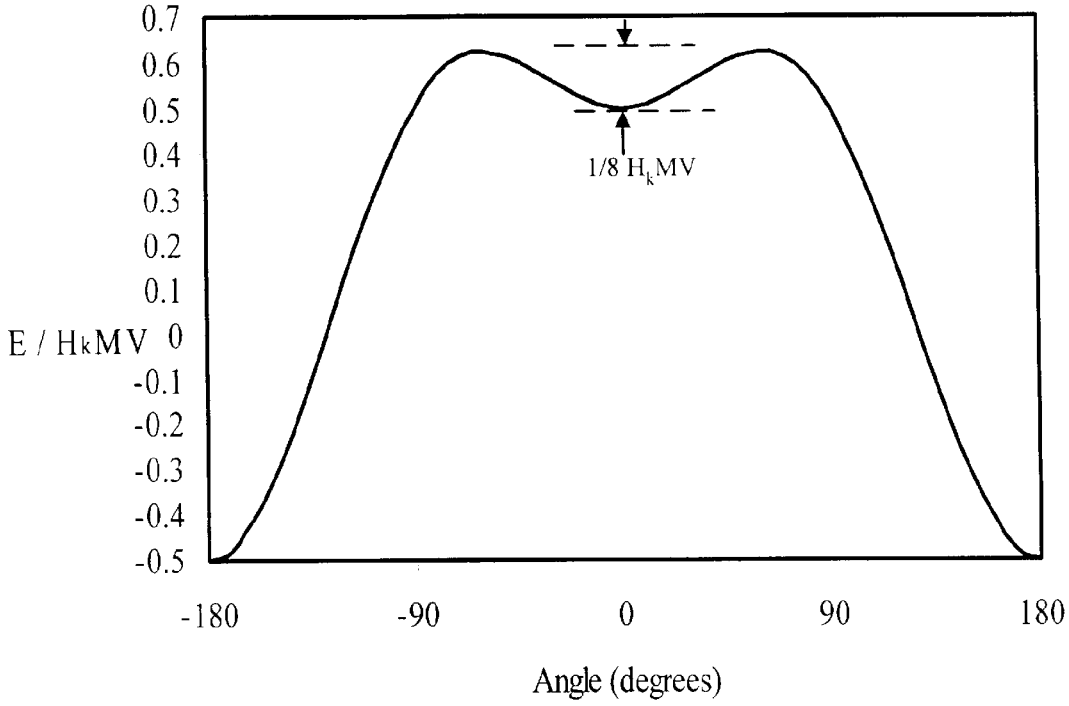
Figure 8B:
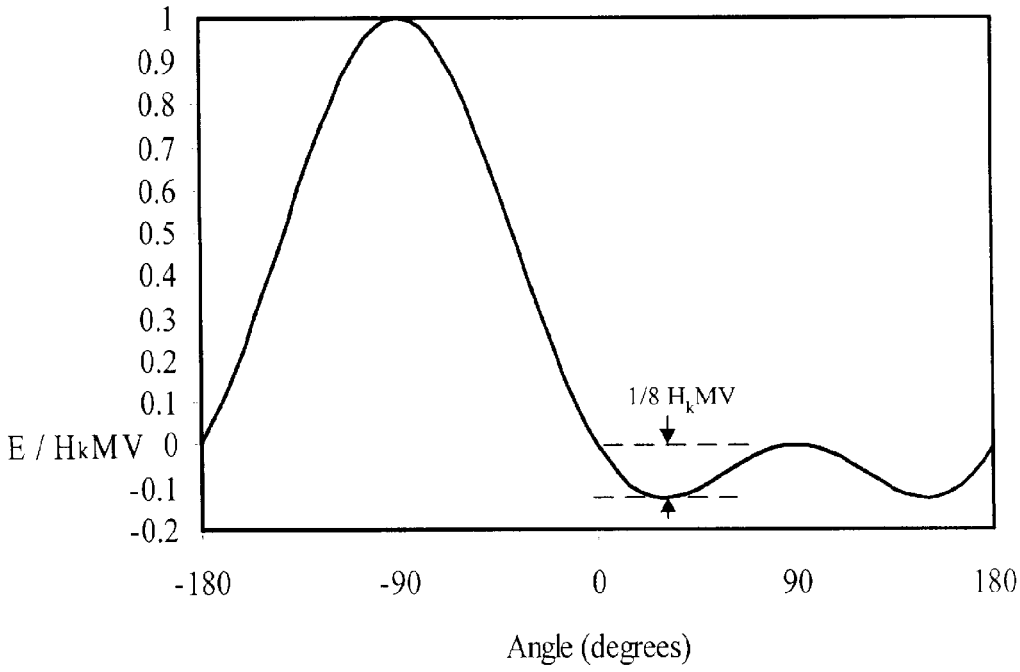

These two equations are plotted in the graphs of FIGS. 8A and 8B. In both cases, the well depth has been reduced by a factor of four, from ½ $MH_kV$ to ⅛ $MH_kV$. A physical memory may be designed with slightly different parameters. However, the important factor is the smallest energy well depth for a half-selected cell. The design objective is to ensure that the memory cells are magnetically stable during the data storing, or magnetic state switching, procedure that is repeatedly undertaken with respect to other cells. However, the trade-off between thermal stability and magnetic stability is a serious problem when the total magnetic volume of bits is less than about $10^5$ $nm^3$.

Consider, for instance, a 256 megabit data storage capacity memory cell array provided as part of a monolithic integrated circuit chip organized so as to have 16 byte data blocks (8×17 binary bits) and having implemented therein the well known Hamming single bit error correction code which adds 8 additional bits. A reasonable sub-array to operate would be organized so that the word lines would each be immediately adjacent to 1088 cells to provide magnetic fields thereabout and the sense lines would each connect in series 128 cells for storing and retrieving data binary bits. The data is to be accessed in sequence in two byte groups.

A worst case can be taken to occur if one block had the data therein retrieved continuously for a year. In this case only one block would experience error correction while the remaining 2 million blocks would not. A total of 78 blocks (64−1+16−1) would be continuously half selected. The unselected blocks with 4 times the well depth can be ignored because their thermally induced failure rate would be negligible.

First, consider the situation without any error correction. For randomly occurring failures in a non-redundant system, reliability theory shows that the total failure rate of the 78 half selected blocks is the sum of the individual failure rates. Also each byte that is present in a block is accessed only ⅛ of the time. Thus to achieve a desired $10^{-5}$ yearly failure rate for the memory, the failure rate for each cell per ⅛ year is given by $$10^{-5}/(78\text{ blocks}*128\text{ cells/block})=1.0016\times10^{-9}\text{ failure}/(\tfrac{1}{8}\text{ a year}).$$

Noting that there are $3.942*10^6$ seconds in ⅛ year, that the relaxation time for a magnetic element of the type considered is about $0.5\times10^{-9}$ seconds, and that if a cell is thermally excited above the barrier, there is a 50% chance it will end in the wrong state, one can compute the required barrier height ($E_b$) as $$1.0016\times10^{-9}=0.5*e^{-(E_b/kT)}*3.942*10^6*1/(0.5*10^{-9}).$$

$$E_b=56.6\text{ kT}$$

(Note: the energy state is randomized with respect to each relaxation time ($t_r$) so that there are $1/t_r$ chances to fail per second.)

If there is single bit error correction, then any single bit error in any half-selected block can be corrected and a failure occurs at the end of the year only if two or more errors occur in a block. For small failure probabilities, the failure rate for two or more elements failing in a block is only very slightly more than two elements failing in a block. For convenience, calculations will be based on two bits failing in a block.

Let "f" be the cell failure probability for an element for a year. Using the fact that the number of ways 2 elements can be selected out of 138 is given by 138×137/2, the required value of f can be calculated as follows:

$$10^{-5}/(78*69*137)=f^2;\ f=0.3683*10^{-6}$$

The required well depth can then be computed directly as follows:

$$0.3683*10^{-6}=0.5*e^{-(E_b kT)}\times3.942*10^6/((0.5*10^{-9})$$

$$E_b=50.7\text{ kT}\ 4*E_b=203\text{ kT}$$

Incidentally, if the full memory was read every 10 hours and corrections made, the required well depth would be reduced by a small amount to 47.3 kT.

Taking the more conservative value of $E_b$=228 kT for unselected memory cells, and assuming the temperature of a half selected cell rises to 400 K during the writing procedure of another cell, and that the saturation magnetization of the storage layer is about 10,000 emu/$cm^3$, and the effective anisotropy of the storage layer is 20 Oe, the minimum volume required to maintain thermal stability is given by the difference between the maximum and minimum energy values, which occur at θ=0 and θ=π/2, through the following relationship:

$$\tfrac{1}{2}\sin^2\theta|\vec{M}||\vec{H}_k|V=228\text{ kT};$$

$$V=2*228(1.381\times10^{-23}\text{ Joules/Kelvin})(400\text{ Kelvin})/(10{,}000\text{ emu/cm}^3)(20\text{ Oe})=12.6*10^{-24}\text{ m}^3=12{,}600\text{ nm}^3.$$

As memory array cell densities increases force reaching such cell dimensions, other ways of making cell selections in the memory array must be used that will allow thermal stability. One such method is the exploitation of the temperature properties of magnetic materials in the cell structures. Specifically, cell structures can be made that have high anisotropy (and a correspondingly deep energy well) at the standard data retrieving temperature, but whose magnetic properties diminish or vanish at a higher data storing temperature. Thus, the storing of data bits is accomplished by coincident applications of heat pulses and externally applied magnetic fields. As described above, the external applications of magnetic fields can be supplemented or replaced by the use of polarized spin currents for switching the cells magnetic states in the storing of data bits therein.

In such arrangements where memory cell structures have data stored therein by selectively heating the structures, the desired rapidity of storage is achieved by using thin isolating layers such as the dielectrics. In thin dielectrics, thermal equilibrium is reached in a very short time. This can be directly calculated by use of the Fourier heat conduction equation and the appropriate material parameters. The temperature rise is given in general by that equation as $$\frac{\partial T}{\partial t} = \frac{k_{th}}{C_p P}\left[\frac{\partial^2 T}{\partial x^2} + \frac{\partial^2 T}{\partial x^2} + \frac{\partial^2 T}{\partial x^2}\right],$$

where T is the temperature, t is the time, $k_{th}$ is the thermal conductivity, P is the density, $C_p$ is the specific heat at constant pressure, and x-y-z are the coordinates. The thermal diffusivity constant is given by $$k_d = \frac{k_{th}}{C_p P}.$$

In one dimension which is a reasonable approximation with a large heat sink directly below the heating sources, the temperature rise is given by $$\frac{\partial T}{\partial t} = k_d \frac{\partial^2 T}{\partial x^2}.$$

Consider a one micron wide line made of 100 Å thick tungsten over 500 Å of silicon dioxide in a substrate having a silicon integrated circuit therebelow with one of the memory cells provided in the silicon dioxide 200 Å below the word line. The thermal conductivity of silicon dioxide is 0.014 Watts/° C. cm, for tungsten 1.87 watts/° C. cm, and for silicon 1.5 watts/° C. cm. Because the silicon has more than 100 times the thermal conductivity of the silicon dioxide, the silicon in the remaining portions of the substrate can be treated as an infinite heat sink. The volume specific heat for silicon dioxide is 2.27 joules/° C. $cm^3$ and for tungsten is 3.66 joules/° C. $cm^3$ The tungsten line has a resistivity of about 8 ohms per square.

Figure 9:
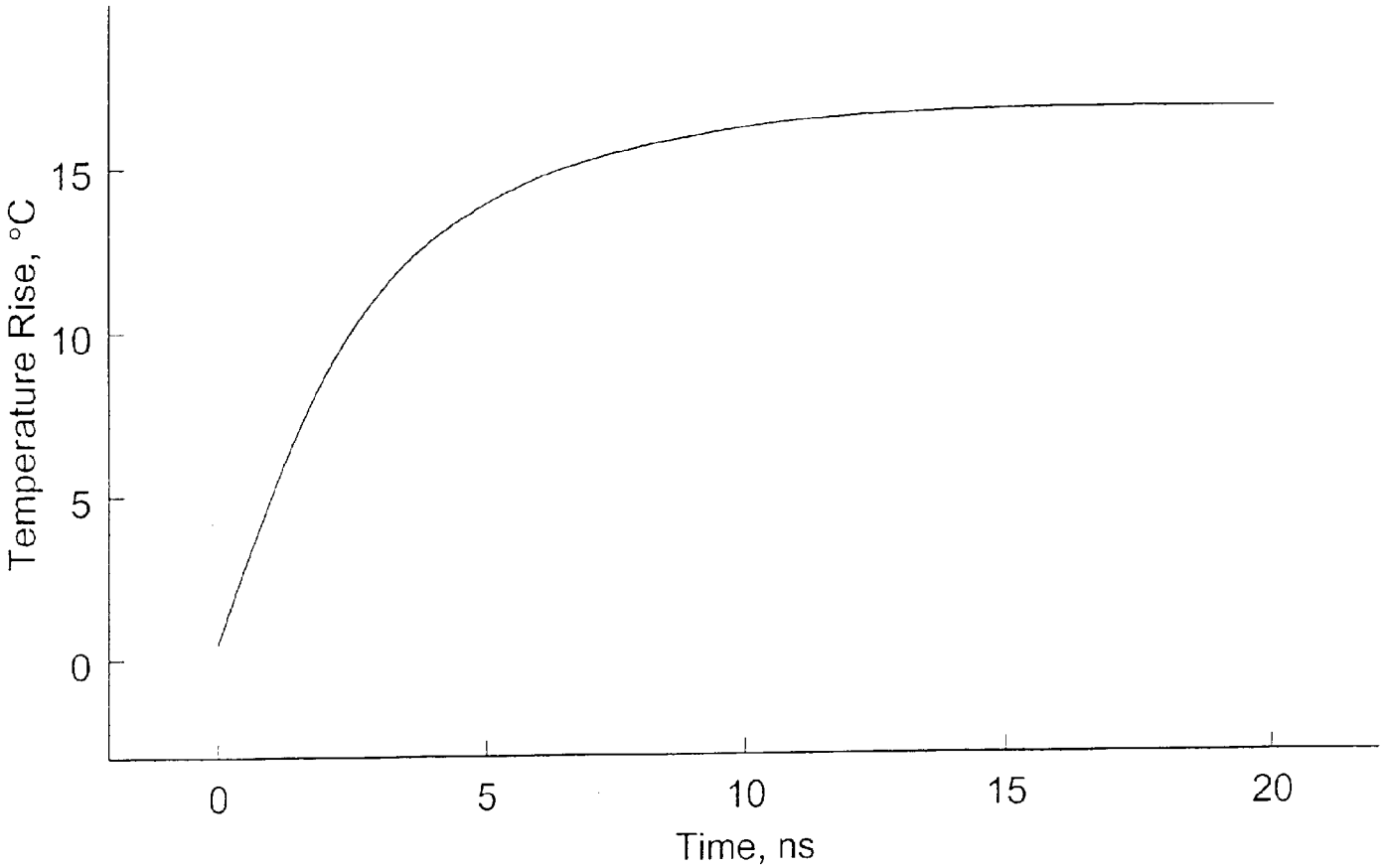

For this example, a 10 mA current was stepped abruptly into the word line and the temperature transient was determined using the above parameters in a numerical solution of the above on dimension diffusion equation. FIG. 9 shows the 17° C. rise reaching 90% of its final value in 6.5 nanoseconds. Thus, thermal time constants are not a limiting factor in storage rapidity for sufficiently small versions of the above described memory cells.

Figure 10A:
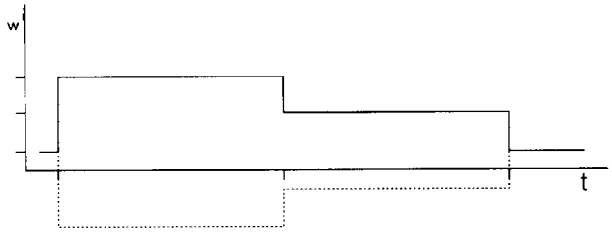

In operation, using coincident pulses in the word current, $I_w$, and in the sense current, $I_s$, to store and retrieve information from these kinds of memory cells, there will be typical waveforms of the kinds illustrated in FIG. 10 corresponding to storage of data based on thermal pulses and FIG. 11 corresponding to data retrieval. In FIG. 10A, a full magnitude current pulse with respect to the initial zero magnitude is applied in the word line adjacent the memory cell in which data is to be stored during the first time period shown. Either a positive current represented by the solid line or, alternatively, a negative current represented by the short dashed line in FIG. 10A can be used depending on the direction of magnetization desired to be stored in the ferromagnetic material associated with the magnetically harder side of the nonmagnetic intermediate layer.

Figure 10B:
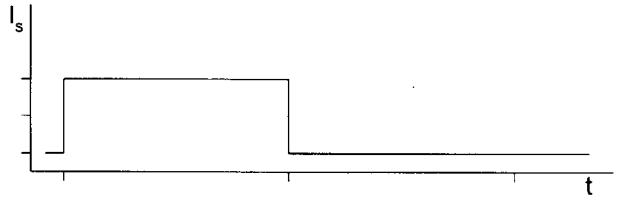

A similar full magnitude current pulse during that first time period is applied through the cell as a sense current as shown in FIG. 10B. Together, the heat generated by these current pulses forces the temperature of the cell up from its ambient value to past either the ferromagnetic material Curie temperature, or the anti ferromagnetic material blocking temperature, depending on the kind of cell, as represented by the long dashed line in FIG. 10C. In this situation, the ferromagnetic material associated with the magnetically harder side of the nonmagnetic intermediate layer can relatively easily have the direction of magnetization therein set in the desired direction to hereby store a bit of data therein as described above.

This storage is accomplished by letting the cell cool below the pertinent one of the Curie or blocking temperatures (represented by the long dashed line in FIG. 10C) while maintaining a magnetization direction setting magnetic field. To do so, the word line current in the second time period shown in FIG. 10A is reduced in magnitude by one half with the remaining half magnitude current serving to provide the direction selection magnetic field for the ferromagnetic material associated with the magnetically harder side of the nonmagnetic intermediate layer during this cooling. The magnetization direction selected depends on which direction through the adjacent word line the word line current follows in being either the solid line current or the short dashed line current of FIG. 10A.

Figure 10C:
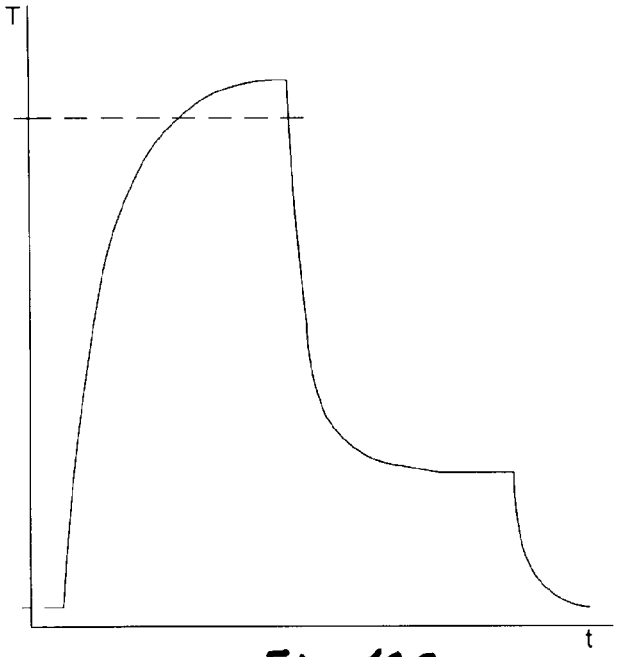

The sense current in the second time period shown in FIG. 10B is reduced to zero to speed cooling. As can be seen in FIG. 10C, the temperature of the cell decreases below the dashed line temperature quickly. Following the second time period shown in FIG. 10A, the word line current is reduced to zero and the cell temperature shown in FIG. 10C falls back to ins ambient value thereby completing the storage operation.

Figure 11A:
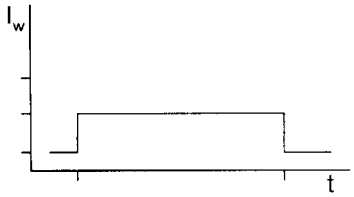
Figure 11B:
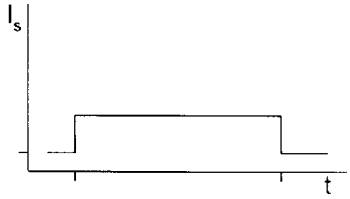
Figure 11C:
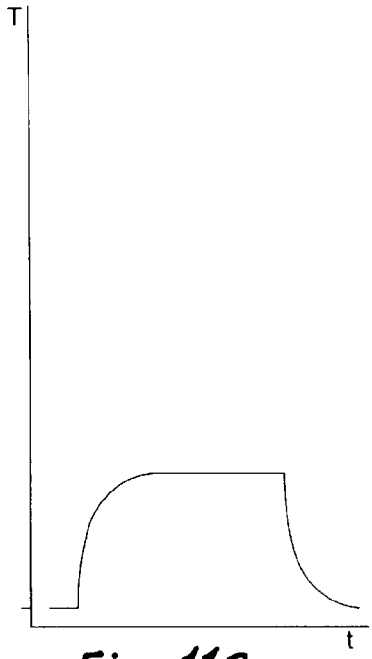

Retrieving information from the same cell as to the direction of magnetization of the ferromagnetic material associated with the magnetically harder side of the nonmagnetic intermediate layer is shown in FIG. 11 to be completed in the one time period shown. A half of the full magnitude current pulse is provided in this time period in both the adjacent word line, as shown in FIG. 11A, and through the cell as shown in FIG. 11B. Retrieval circuitry not shown senses any cell resistance value change to make the determination as to the direction of magnetization of the ferromagnetic material associated with the magnetically harder side of the nonmagnetic intermediate layer to thereby retrieve the data represented by this direction. As shown in FIG. 11C, the cell temperature does not rise significantly since in these circumstances only a quarter of the power is dissipated compared to the power dissipated in the first time period involved with the storing of data shown in FIG. 10A.

Figure 2A:
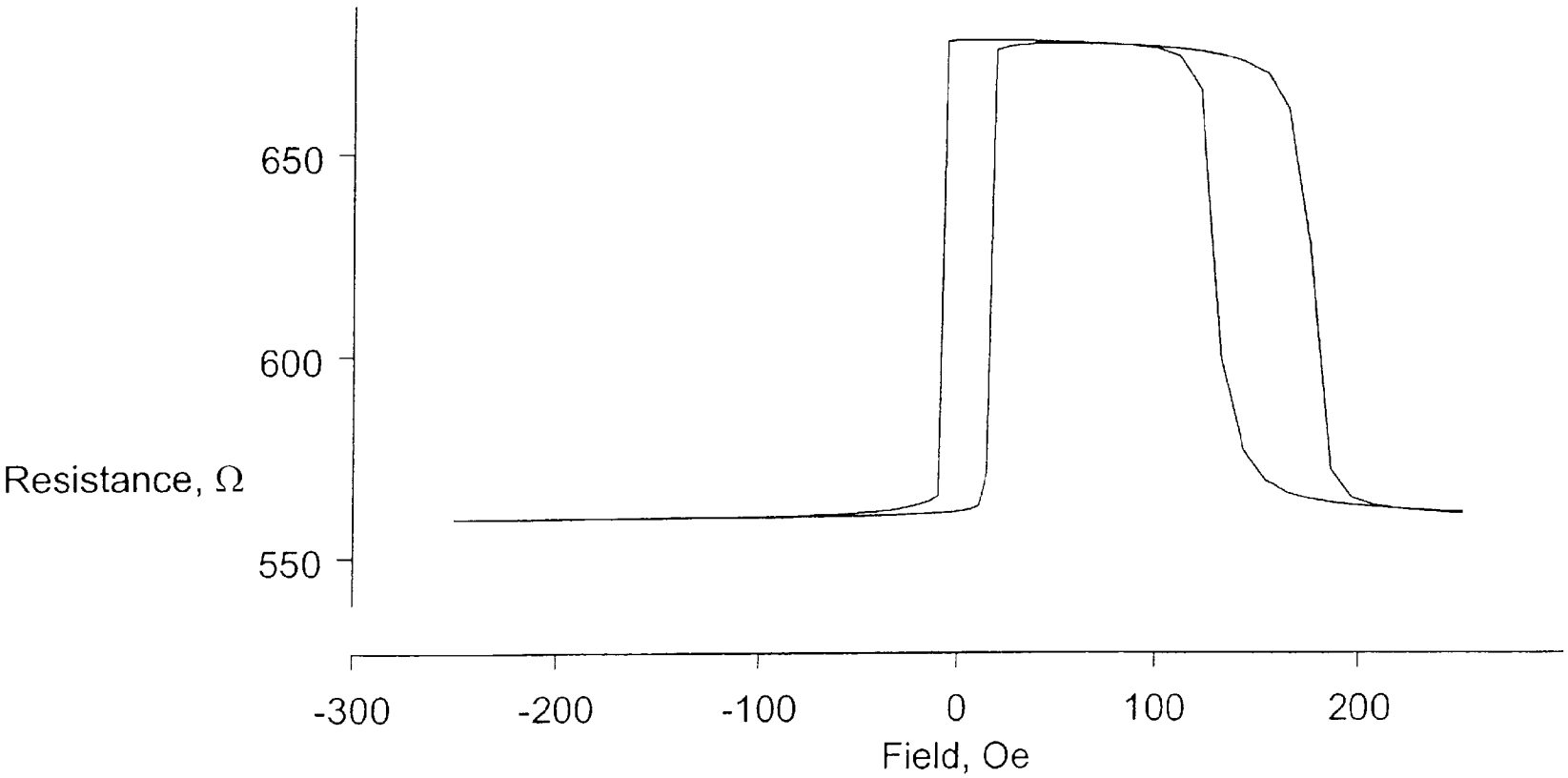
FIGS. 2A and 2B represents graph of a response for a structure similar to one of those shown in FIGS. 1A and 1B and other structures herein.

FIG. 2A also shows the major resistance versus applied field characteristics for a "pinned" layer spin dependent tunneling memory cell having the maintained magnetization direction oriented in one direction along the length of that cell. A mirror image characteristic, i.e. essentially the same characteristic as shown in FIG. 2A rotated about the resistance axis, results for maintained magnetization direction oriented in the opposite direction along the length of that cell. During storage of data therein, however, these characteristics are transformed as the blocking temperature for the "pinning" layer is reached by either essentially collapsing if the blocking temperature exceeds the Curie temperature of the adjacent ferromagnetic layer or reverting to the major resistance versus applied field characteristics of just the ferromagnetic layers if it does not.

Figure 2B:
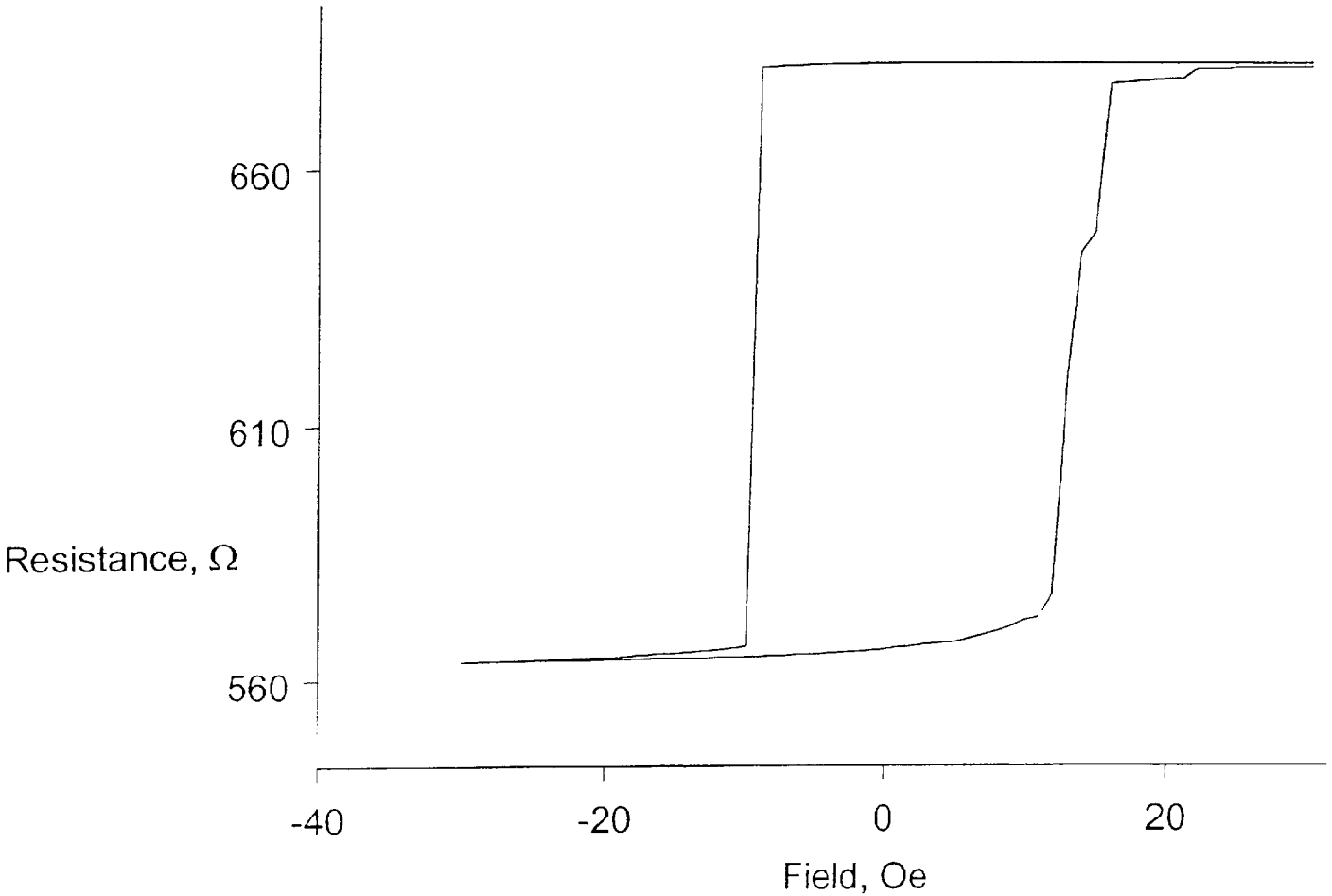

During retrieval of data from this memory cell, field magnitudes only relatively near zero are applied to these characteristics so that the operating point moves from one to the other of the two resistance lobes shown in FIG. 2A. This behavior again effectively results in a minor loop characteristic for retrieval purposes as is shown in FIG. 2B.

Figure 12:
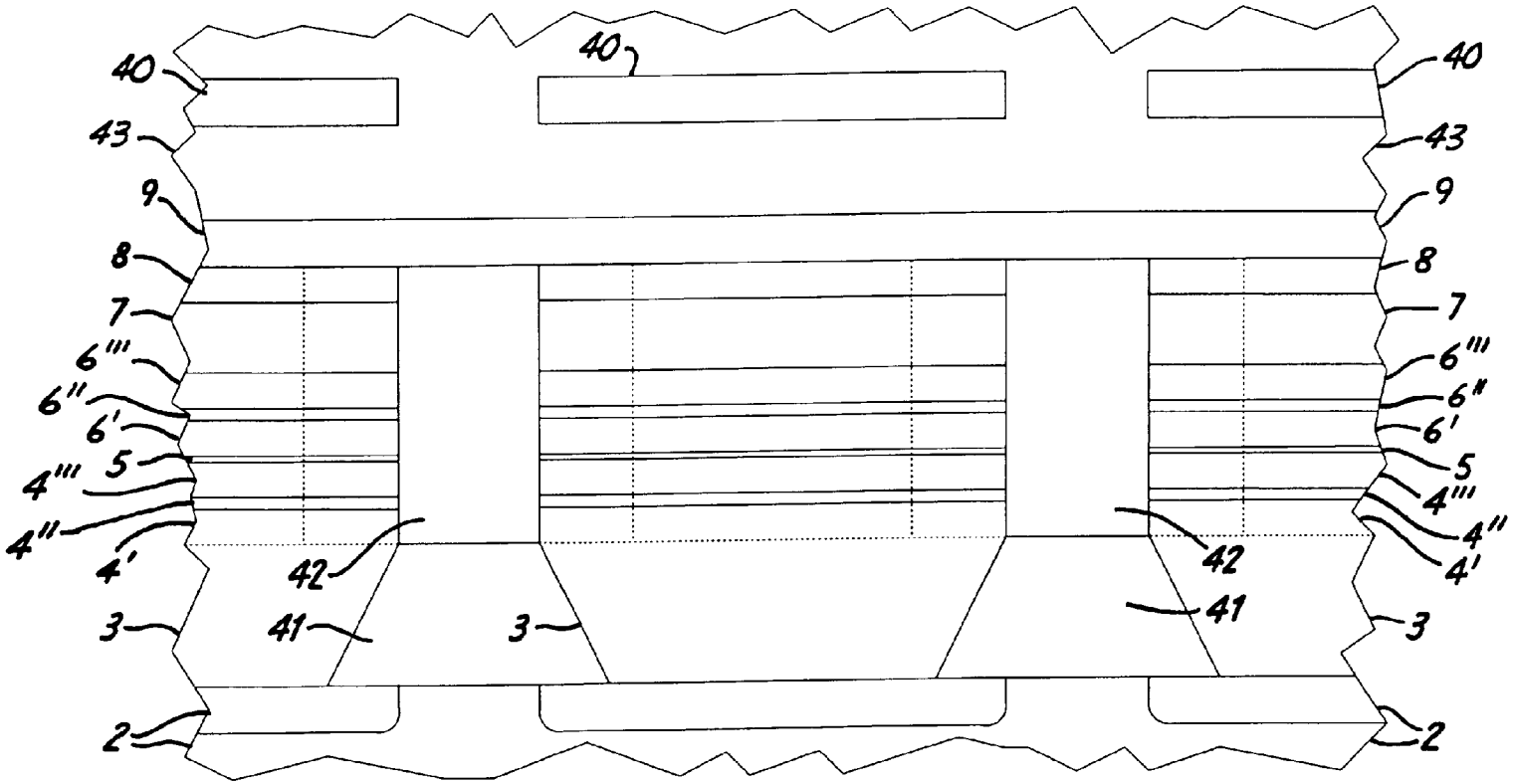

A cross section view of a spin-current based data storage memory array provided as part of a monolithic integrated circuit also using thermal pulses to store data is shown in FIG. 12 based on each memory cell using the device of FIG. 3 with substrate 2 being part of the integrated circuit semiconductor material with junction isolated regions as shown. The same numerical designations are used in each of these figures for similar features. A plurality of thermal pulse providing word lines, 40, are provided in and out of the plane of the figure above the array of memory cell devices having successive rows of memory cells in each of which the cells are electrically connected in common to form a bit line for each such row. Thus, thermal pulse word lines 40 each pass over many bit lines. Thermal pulse word lines 40 are formed of a high resistivity metal such as tungsten in order to generate the most heat and reduce lateral thermal conductivity within the line. The memory cell devices are electrically connected at the top electrode thereof by common bit line 9.

The thermally operated memory cells in the array must function independently of one another, and so the thermal conduction paths in and around each cell must allow one cell to be brought above its storing temperature based on the Curie or blocking temperatures of the magnetic material layers therein while nearby cells remain below their thermally stable temperature. This balance is achieved by limiting thermal conductivity between the adjacent cells through suitable choices of a bottom electrode separating dielectric material layer, 41, a device separating dielectric material layer, 42, and a word line and device separating dielectric material layer, 43, both as to kind of material and the separating thicknesses thereof. Similarly, the material and dimensions of bottom electrode 2, and the material and dimensions of common bit line 9, must be chosen suitably to limit there contributions sufficiently to the thermal conductivity between adjacent devices.

The memory cell devices in FIGS. 1, 3 through 5, and another to be described below, can all be modified to use thermal pulse based data storage, or writing, techniques based on the thermal pulse accompanying a current pulse. Ferromagnetic material storage layers such as 11' and 12' can have a reduced Curie point temperature obtained, for examiple, by adding chromium to the NiFe material typically used therein, or by using a very thin storage layer for these two layers. If storing currents established between interconnections 2 and 9, or 26 and 27, are sufficient to heat these storage layers to the Curie point temperatures thereof, then much less magnetic field strength would be needed to change the magnetic states of the storage layers and the values of the corresponding storing currents could be reduced.

Also, separately from the foregoing, or together with it, a Néel point cell could be made by substituting an anti ferromagnet material for ruthenium layer 13¢ between storage layers 11' and 12'. If the storing currents heat the antiferromagnet between storage layers 11' and 12' above the Néel point, then the antiferromagnetic/ferromagnetic exchange coupling between these two storage layers would be broken, anrd the magnetic field associated with the storing current would cause the corresponding magnetization state to occur in these storage layers to thereby store the data bit desired to be stored in that memory cell. As the cell cools, the cell will have a deep storage energy well by virtue of the very large exchange fields that the antiferromagnetic provided between the storage layers provides.

Note that in this case, the antiparallel coupling between the two storage layers can no longer be provided by the omitted ruthenium layer, and that instead, magnetostatic coupling would have to supply the antiparallel coupling. In even very thin films, this coupling becomes very large as cell dimensions approach and become less than 1000 Å. Even a slight ellipticity in the cell shape will give a very substantial anisotropy. For example, a 30 Å circular film 100 nm in diameter with an $M_s$ of 10K Oe would have a self-demagnetization field of about 240 Oe. Ellipticity would make the magnetization lie along the long axis due to shape anisotropy, and the stray fields in one storage layer would magnetize the other storage layer in an antiparallel state.

Figure 13:
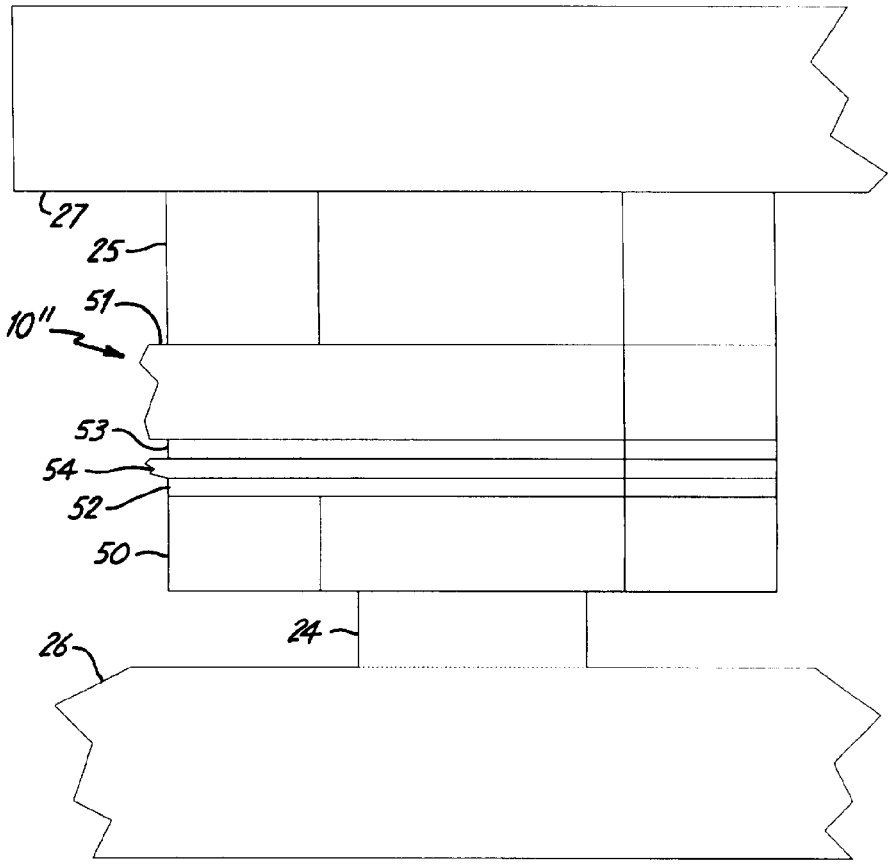
FIGS. 12 and 13 represent layer diagrams of portions of monolithic integrated circuit structures embodying the present invention.

A simpler structure is described below but this structure has shortcomings which will make the advantages of the previously described devices clearer. The layer diagram for this simpler structure memory cell, 10", is shown in FIG. 13. Interconnections 26 and 27 are again present along with aluminum cap 25 and plug 24. However, there are no antiferromagnetic layers and no tunnel junction barrier layers. Instead, a pair of relatively thick (125 Å) ferromagnetic layers, 50 and 51, are directly on plug 24 and directly support cap 25, respectively, and they have between them two 25 Å thick copper layers, 52 and 53, which in turn have between them a relatively thin ferromagnetic data storage layer, 54. This arrangement, in effect, provides two giant magnetoresistive effect devices in series between interconnections 26 and 27. An output signal is taken from the upper of such devices so that ferromagnetic layers 51 and 44 are shown as providing output interconnections also.

A copper intermediate layer in the giant magnetoresistive devices means that the output signal will be taken from a vertical GMR device with only two interfaces yielding a relatively small output signal value. Also, because of symmetry, there is no signal unless storage layer 54 is in the output interconnection. The output signal in the memory cells of FIGS. 4 and 5 is greatly enhanced by the use of tunnel barriers, and the asymmetric configuration of the FIG. 5 memory cell overcomes the difficulty of contacting the inner storage layers in the FIGS. 4 and 13 memory cells.

The device of FIG. 13 relies on material properties for the high coercivity of ferromagnetic layers 50 and 51, here shown being provided by the relatively large thicknesses thereof which is very risky because the material magnetization can be disturbed in orientation relatively easily by external magnetic fields. The two outer ferromagnetic layers can be magnetized in opposite directions by having permnanent magnetic material substituted therefor, or perhaps by making one much thicker than the other (not shown). The memory cells of FIGS. 4 and 5 provide pinning with First Named antiferromagnets and allow a commjon device fabrication annealing field direction to be used. By making one of the magnetic layers in a synthetic antiferromagnet slightly thicker than the other, the pinning direction of the magnetic layer nearest the storage layer can be controlled. This much more reliable method of control of the pinned directions is used in the FIGS. 4 and 5 devices.

Stray magnetic fields between memory cells of the kind shown in FIGS. 1 and 13 are very large, and can disturb nearby cells and thus limit miniaturization of a memory using such cells. The memory cells of FIGS. 4 and 5 avoid generating stray magnetic fields of any appreciable strength through the use of synthetic antiferromagnets implemented through the use of a thin ruthenium layer. Stability of the memory cells in FIGS. 4 and 5 is increased over that of FIGS. 1 and 13 by greatly reducing stray fields and susceptibility to external fields through the uses of synthetic antiferromagnets and antiferromagnetic pinning. Further improvements in stability are attainable through he uses of Néel or Curie point wrtitng or both.

Stray fields can be reduced even further by using a "doughnut" shape for the memory cells rather than the long and narrow cells of FIGS. 1, 3 through 5, and 13. The magnetizations in a given ferromagnetic layer then circle around the center, and thus there are very few free poles. The switching properties of the spin-polarized current are not affected by such a shape, however, nor is the strong anti-parallel exchange coupling across thin Ru (or Cu) layers.

Memories as described above use a transistor per cell to select the cell for data storage and retrieving. The low current levels needed to operate the cells allow the transistor to be small in size. Thermal pulse data storage techniques can also be used to enhance stability.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory cell, said memory cell comprising:

a substrate; and a bit structure formed of a plurality of layers provided in a selected sequence between a pair of electrodes in electrical contact therewith at opposite ends of said sequence and supported on said substrate comprising:

a memory film of an anisotropic ferromagnetic material capable of conducting an electrical current therethrough;

a source layer positioned on one side of said memory film capable of conducting an electrical current therethrough so that a majority of conduction electrons passing therefrom have a selected spin orientation; and a disruption layer positioned on another side of said memory film capable of conducting an electrical current therethrough so that conduction electrons spins passing therefrom are substantially random in orientation.

2. The device of claim 1 further comprising an electrically insulative intermediate layer provided between said source layer and said memory film.

3. The device of claim 1 wherein said source layer is a first source layer and said memory film is a first memory film, and further comprises a second memory film of an anisotropic ferromagnetic material positioned on an opposite side of said disruption layer from said first memory film and capable of conducting an electrical current therethrough, and a second source layer positioned on an opposite side of said second memory film from said disruption layer capable of conducting an electrical current therethrough so that a majority of conduction electrons passing therefrom have a selected spin orientation.

4. The device of claim 1 wherein a said memory film and said source layer have a length along a selected direction and a width substantially perpendicular thereto that is smaller in extent than said length and have a shaped end portion extending over a portion of said length in which said width gradually reduces to zero at that corresponding end thereof.

5. The device of claim 1 wherein said source layer is of a ferromagnetic material and further comprising a magnetization reference layer positioned at least in part on a side of said source layer opposite said memory film and resulting in said source layer having a relatively fixed magnetization direction.

6. The device of claim 3 further comprising a first electrically insulative intermediate layer provided between said first source layer and said first memory film, and a second electrically insulative intermediate layer provided between said second source layer and said second memory film.

7. The device of claim 3 further comprising a first electrically insulative intermediate layer provided between said first source layer and said first memory film, and a conductive intermediate layer provided between said second source layer and said second memory film.

8. The device of claim 3 wherein said first and second source layers are of ferromagnetic materials and further comprising a first magnetization reference layer positioned at least in part on a side of said first source layer opposite said first memory film and resulting in said first source layer having a relatively fixed magnetization direction, and a second magnetization reference layer positioned at least in part on a side of said second source layer opposite said second memory film and resulting in said second source layer having a relatively fixed magnetization direction.

9. The apparatus of claim 5 wherein said magnetization reference layer comprises an antiferromagnetic layer.

10. The apparatus of claim 8 wherein said first magnetization reference layer comprises a first antiferromagnetic layer, and said second magnetization reference layer comprises a second antiferromagnetic layer.

11. The apparatus of claim 9 wherein said magnetization reference layer further comprises a reference ferromagnetic thin-film layer provide between said antiferromagnetic layer and said source layer but separated from said source layer by an antiparallel magnetization directing layer forcing those magnetizations of said reference ferromagnetic thin-film layer and said source layer to be oppositely directed.

12. The apparatus of claim 10 wherein said first magnetization reference layer farther comprises a first reference ferromagnetic thin-film layer provide between said first antiferromagnetic layer and said first source layer but separated from said first source layer by a first antiparallel magnetization directing layer forcing those magnetizations of said first reference ferromagnetic thin-film layer and said first source layer to be oppositely directed, and a second reference ferromagnetic thin-film layer provide between said second antiferromagnetic layer and said second source layer but separated from said second source layer by a second antiparallel magnetization directing layer forcing those magnetizations of said second reference ferromagnetic thin-film layer and said second source layer to be oppositely directed.

13. The device of claim 1 wherein said substrate further comprises a monolithic integrated circuit structure containing electronic circuit components of which at least one is electrically connected to one of said electrodes.

14. The device of claim 2 wherein said electrically insulative intermediate layer is sufficiently thin so as to have a barrier resistance area product that is less than 2 $\Omega$-$\mu m^2$.

15. The device of claim 2 wherein said source layer is of a ferromagnetic material and further comprising a magnetization reference layer positioned at least in part on a side of said source layer opposite said memory film and resulting in said source layer having a relatively fixed magnetization direction.

16. The device of claim 6 wherein said first and second source layers are of ferromagnetic materials and further comprising a first magnetization reference layer positioned at least in part on a side of said first source layer opposite said first memory film and resulting in said first source layer having a relatively fixed magnetization direction, and a second magnetization reference layer positioned at least in part on a side of said second source layer opposite said second memory film and resulting in said second source layer having a relatively fixed magnetization direction.

17. The device of claim 6 wherein said first and second electrically insulative intermediate layers are sufficiently thin so as to each have a barrier resistance area product that is less than 2 $\Omega$-$\mu m^2$.

18. The device of claim 9 further comprising a plurality of memory cells including said memory cell and an electrical current conductor positioned across an insulating layer from said memory cell.

19. The device of claim 10 further comprising a plurality of memory cells including said memory cell and an electrical current conductor positioned across an insulating layer from said memory cell.

20. The device of claim 11 wherein said source layer and said reference ferromagnetic thin-film layer are of unequal thicknesses.

21. The device of claim 12 wherein said first source layer and said first reference ferromagnetic thin-film layer are of unequal thicknesses, and said second source layer and said second reference ferromagnetic thin-film layer are of unequal thicknesses.

22. The device of claim 15 wherein said electrically insulative intermediate layer is sufficiently thin so as to have a barrier resistance area product that is less than 2 $\Omega$-$\mu m^2$.

23. The device of claim 16 wherein said first and second electrically insulative intermediate layers are sufficiently thin so as to each have a barrier resistance area product that is less than 2 $\Omega$-$\mu m^2$.

24. The device of claim 18 wherein said plurality of memory cells are each supported on a substrate and separated from one another by spacer material therebetween, and wherein a magnetic material layer in said magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

25. The device of claim 19 wherein said plurality of memory cells are each supported on a substrate and separated from one another by spacer material therebetween, and wherein a magnetic material layer in said first magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

26. A ferromagnetic thin-film based digital memory cell, said memory cell comprising:

a substrate; and a bit structure formed of a plurality of layers provided in a selected sequence between a pair of electrodes in electrical contact therewith at opposite ends of said sequence and supported on said substrate comprising:

an electrically insulative intermediate layer;

a source layer on one side of said insulative intermediate layer capable of conducting an electrical current therethrough so that a majority of conduction electrons passing therefrom have a selected spin orientation;

a memory film of an anisotropic ferromagnetic material on another side of said insulative intermediate layer capable of conducting an electrical current therethrough; and an antiparallel maintenance layer adjacent to a ferromagnetic material layer together on a side of at least one of said source layer and said memory film across from said intermediate layer.

27. The device of claim 26 wherein said substrate further comprises a monolithic integrated circuit structure containing electronic circuit components of which at least one is electrically connected to one of said electrodes.

28. The device of claim 26 wherein said source layer is a first source layer and said memory film is a first memory film, and further comprises a second memory film of an anisotropic ferromagnetic material positioned on an opposite side of said antiparallel maintenance layer from said first memory film and capable of conducting an electrical current therethrough, and a second source layer positioned on an opposite side of said second memory film from said anti-parallel maintenance layer capable of conducting an electrical current therethrough so that a majority of conduction electrons passing therefrom have a selected spin orientation.

29. The device of claim 26 wherein a said memory film and said source layer have a length along a selected direction and a width substantially perpendicular thereto that is smaller in extent than said length and have a shaped end portion extending over a portion of said length in which said width gradually reduces to zero at that corresponding end thereof.

30. The device of claim 26 wherein said source layer is of a ferromagnetic material and further comprising magnetization reference layer positioned at least in part on a side of said source layer opposite said memory film and resulting in said source layer having a relatively fixed magnetization direction.

31. The device of claim 26 wherein said electrically insulative intermediate layer is sufficiently thin so as to have a barrier resistance area product that is less than 2 $\Omega$-$\mu m^2$.

32. The device of claim 28 wherein said electrically insulative intermediate layer is a first electrically insulative intermediate layer, and further comprising a second electrically insulative intermediate layer provided between said second source layer and said second memory film.

33. The device of claim 28 wherein said first and second source layers are of ferromagnetic materials and further comprising a first magnetization reference layer positioned at least in part on a side of said first source layer opposite said first memory film and resulting in said first source layer having a relatively fixed magnetization direction, and a second magnetization reference layer positioned at least in part on a side of said second source layer opposite said second memory film and resulting in said second source layer having a relatively fixed magnetization direction.

34. The apparatus of claim 30 wherein said magnetization reference layer comprises an antiferromagnetic layer.

35. The device of claim 30 wherein said electrically insulative intermediate layer is sufficiently thin so as to have a barrier resistance area product that is less than 2 $\Omega$-$\mu m^2$.

36. The device of claim 32 wherein said first and second electrically insulative intermediate layers are sufficiently thin so as to each have a barrier resistance area product that is less than 2 $\Omega$-$\mu m^2$.

37. The device of claim 32 wherein said first and second source layers are of ferromagnetic materials and further comprising a first magnetization reference layer positioned at least in part on a side of said first source layer opposite said first memory film and resulting in said first source layer having a relatively fixed magnetization direction, and a second magnetization reference layer positioned at least in part on a side of said second source layer opposite said second memory film and resulting in said second source layer having a relatively fixed magnetization direction.

38. The apparatus of claim 33 wherein said first magnetization reference layer comprises a first antiferromagnetic layer, and said second magnetization reference layer comprises a second antiferromagnetic layer.

39. The device of claim 34 further comprising a plurality of memory cells including said memory cell and an electrical current conductor positioned across an insulating layer from said memory cell.

40. The device of claim 37 wherein said first and second electrically insulative intermediate layers are sufficiently thin so as to each have a barrier resistance area product that is less than 2 $\Omega$-$\mu m^2$.

41. The device of claim 38 further comprising a plurality of memory cells including said memory cell and an electrical current conductor positioned across an insulating layer from said memory cell.

42. The device of claim 39 wherein said plurality of memory cells are each supported on a substrate and separated from one another by spacer material therebetween, and wherein a magnetic material layer in said magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

43. The device of claim 41 wherein said plurality of memory cells are each supported on a substrate and separated from one another by spacer material therebetween, and wherein a magnetic material layer in said first magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

44. A ferromagnetic thin-film based digital memory cell, said memory cell comprising:

a substrate; and a bit structure formed of a plurality of layers provided in a selected sequence between a pair of electrodes in electrical contact therewith at opposite ends of said sequence and supported on said substrate comprising:

an electrically conductive intermediate layer;

a source layer on one side of said conductive intermediate layer capable of conducting an electrical current therethrough so that a majority of conduction electrons passing therefrom have a selected spin orientation;

a memory film of an anisotropic ferromagnetic material on another side of said conductive intermediate layer capable of conducting an electrical current therethrough, and an antiparallel maintenance layer adjacent to a ferromagnetic material layer together on a side of at least one of said source layer and said memory film across from said intermediate layer.

45. The device of claim 44 wherein said substrate further comprises a monolithic integrated circuit structure containing electronic circuit components of which at least one is electrically connected to one of said electrodes.

46. The device of claim 44 wherein said source layer is a first source layer and said memory film is a first memory film, and further comprises a second memory film of an anisotropic ferromagnetic material positioned on an opposite side of said antiparallel maintenance layer from said first memory film and capable of conducting an electrical current therethrough, and a second source layer positioned on an opposite side of said second memory film from said anti-parallel m aintenance layer capable of conducting an electrical current therethrough so that a majority of conduction electrons passing therefrom have a selected spin orientation.

47. The device of claim 44 wherein a said memory film and said source layer have a length along a selected direction and a width substantially perpendicular thereto that is smaller in extent than said length and have a shaped end portion extending over a portion of said length in which said width gradually reduces to zero at that corresponding end thereof.

48. The device of claim 44 wherein said source layer is of a ferromagnetic material and further comprising magnetization reference layer positioned at least in part on a side of said source layer opposite said memory film and resulting in said source layer having a relatively fixed magnetization direction.

49. The device of claim 46 further comprising an electrically insulative intermediate layer provided between said second source layer and said second memory film.

50. The device of claim 46 wherein said first and second source layers are of ferromagnetic materials and further comprising a first magnetization reference layer positioned at least in part on a side of said first source layer opposite said first memory film and resulting in said first source layer having a relatively fixed magnetization direction, and a second magnetization reference layer positioned at least in part on a side of said second source layer opposite said second memory film and resulting in said second source layer having a relatively fixed magnetization direction.

51. The apparatus of claim 48 wherein said magnetization reference layer comprises an antiferromagnetic layer.

52. The device of claim 49 wherein said electrically insulative intermediate layer is sufficiently thin so as to have a barrier resistance area product that is less than 2 $\Omega$-$\mu m^2$.

53. The device of claim 49 wherein said source layer is of a ferromagnetic material and further comprising magnetization reference layer positioned at least in part on a side of said source layer opposite said memory film and resulting in said source layer having a relatively fixed magnetization direction.

54. The apparatus of claim 50 wherein said first magnetization reference layer comprises a first antiferromagnetic layer, and said second magnetization reference layer comprises a second antiferromagnetic layer.

55. The device of claim 51 further comprising a plurality of memory cells including said memory cell and an electrical current conductor positioned across an insulating layer from said memory cell.

56. The device of claim 53 wherein said electrically insulative intermediate layer is sufficiently thin so as to have a barrier resistance area product that is less than 2 $\Omega$-$\mu m^2$.

57. The device of claim 54 further comprising a plurality of memory cells including said memory cell and an electrical current conductor positioned across an insulating layer from said memory cell.

58. The device of claim 55 wherein said plurality of memory cells are each supported on a substrate and separated from one another by spacer material therebetween, and wherein a magnetic material layer in said magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

59. The device of claim 57 wherein said plurality of memory cells are each supported on a substrate and separated from one another by spacer material therebetween, and wherein a magnetic material layer in said first magnetization reference layer has a characteristic magnetic property that is maintained below a critical temperature above which such magnetic property is not maintained, said memory cells each having a first interconnection structure providing electrical contact thereto positioned against at least one side thereof, and said electrical conductor exhibits sufficient electrical resistance where across from a said memory cell for a sufficient electrical current therethrough to cause substantial heating of said memory cell to raise temperatures thereof to have said magnetic material layer therein approach said critical temperature thereof while being substantially above temperatures of at least an adjacent said memory cell because of sufficient extents of, and smallness of thermal conductivities of, said first interconnection structure positioned against said memory cell and of those portions of said substrate and said spacer material positioned thereabout.

*60. The device of claim 1, wherein when a write current flows through the bit structure between the pair of electrodes, the electrical current conducted through the memory film is capable of reorienting magnetization of the memory film by spin momentum transfer.*

*61. The device of claim 60, wherein the source layer is part of a first synthetic antiferromagnet (SAF), wherein the memory film and the disruption layer are part of a second synthetic antiferromagnet (SAF), and wherein the source layer and the memory film are separated by a spacer layer.*

*62. The device of claim 61, wherein the spacer layer comprises an electrically insulative layer.*

*63. The device of claim 62, wherein the source layer has a fixed magnetization.*

*64. The device of claim 63, and further comprising an antiferromagnetic layer in contact with the first SAF.*

*65. The device of claim 60, wherein the source layer has a fixed magnetization.*

*66. The device of claim 65, wherein the write current has a current density and polarization that are large enough to switch magnetization direction of the memory film.*

*67. The device of claim 66, wherein the current density is at least about $10^7$ amps/$cm^2$.*

*68. The device of claim 60, wherein the disruption layer is a ruthenium layer.*

*69. The device of claim 1, wherein the bit structure is configured to allow magnetization of the memory film to change direction due to spin momentum transfer when a write current is passed through the bit structure.*

*70. The device of claim 69, wherein the source layer is part of a first synthetic antiferromagnet (SAF), wherein the memory film and the disruption layer are part of a second synthetic antiferromagnet (SAF), and wherein the source layer and the memory film are separated by a spacer layer.*

*71. The device of claim 69, wherein the spacer layer comprises an electrically insulative layer.*

*72. The device of claim 71, wherein the source layer has a fixed magnetization.*

*73. The device of claim 72, and further comprising an antiferromagnetic layer in contact with the first SAF.*

*74. The device of claim 69, wherein the source layer has a fixed magnetization.*

*75. The device of claim 69, wherein the write current has a current density and polarization that are large enough to switch magnetization direction of the memory film.*

*76. The device of claim 69, wherein the current density is at least about $10^7$ amps/$cm^2$.*

*77. The device of claim 69, wherein the disruption layer is a ruthenium layer.*

*78. The device of claim 1, wherein the memory film is capable of switching magnetization direction in response to spin momentum transfer from electrons having the selected spin orientation that pass through the memory film.*

*79. The device of claim 1, wherein magnetization direction of the memory film is changed by spin momentum transfer by electrical current from the source layer passing through the memory film.*

*80. The device of claim 1, wherein the electrical contacts apply a write current through the bit structure that causes magnetization of the memory film to switch by spin momentum transfer.*

*81. The device of claim 1, wherein the electrodes apply a write current through the bit structure to affect a direction of magnetization of the memory film.*

*82. The device of claim 81, wherein the write current has a current density and polarization that are large enough to switch magnetization direction of the memory film.*

*83. The device of claim 82, wherein the current density is at least about $10^7$ amps/cm$^2$.*

*84. The device of claim 26, wherein when a write current flows through the bit structure between the pair of electrodes, the electrical current conducted through the memory film is capable of reorienting magnetization of the memory film by spin momentum transfer.*

*85. The device of claim 84, wherein the source layer is part of a first synthetic antiferromagnet (SAF), and wherein the memory film and the disruption layer are part of a second synthetic antiferromagnet (SAF).*

*86. The device of claim 85, wherein the source layer has a fixed magnetization.*

*87. The device of claim 86, and further comprising an antiferromagnetic layer in contact with the first SAF.*

*88. The device of claim 84, wherein the source layer has a fixed magnetization.*

*89. The device of claim 88, wherein the write current has a current density and polarization that are large enough to switch magnetization direction of the memory film.*

*90. The device of claim 89, wherein the current density is at least about $10^7$ amps/cm$^2$.*

*91. The device of claim 84, wherein the disruption layer is a ruthenium layer.*

*92. The device of claim 26, wherein the bit structure is configured to allow magnetization of the memory film to change direction due to spin momentum transfer when a write current is passed through the bit structure.*

*93. The device of claim 92, wherein the source layer is part of a first synthetic antiferromagnet (SAF), and wherein the memory film and the disruption layer are part of a second synthetic antiferromagnet (SAF).*

*94. The device of claim 93, wherein the source layer has a fixed magnetization.*

*95. The device of claim 94, and further comprising an antiferromagnetic layer in contact with the first SAF.*

*96. The device of claim 92, wherein the source layer has a fixed magnetization.*

*97. The device of claim 96, wherein the write current has a current density and polarization that are large enough to switch magnetization direction of the memory film.*

*98. The device of claim 97, wherein the current density is at least about $10^7$ amps/cm$^2$.*

*99. The device of claim 92, wherein the disruption layer is a ruthenium layer.*

*100. The device of claim 26, wherein the memory film is capable of switching magnetization direction in response to spin momentum transfer from electrons having the selected spin orientation that pass through the memory film.*

*101. The device of claim 26, wherein magnetization direction of the memory film is changed by spin momentum transfer by electrical current from the source layer passing through the memory film.*

*102. The device of claim 26, wherein the electrical contacts apply a write current through the bit structure that causes magnetization of the memory film to switch by spin momentum transfer.*

*103. The device of claim 26, wherein the electrodes apply a write current through the bit structure to affect a direction of magnetization of the memory film.*

*104. The device of claim 26, wherein the write current has a current density and polarization that are large enough to switch magnetization direction of the memory film.*

*105. The device of claim 26, wherein the current density is at least about $10^7$ amps/cm$^2$.*

* * * * *